(12) United States Patent
Zhang

(10) Patent No.: US 10,692,936 B2
(45) Date of Patent: Jun. 23, 2020

(54) IMAGE SENSORS

(71) Applicant: Samsung Electronics Co., Ltd., Suwon-si, Gyeonggi-do (KR)

(72) Inventor: Gang Zhang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/110,521

(22) Filed: Aug. 23, 2018

(65) Prior Publication Data
US 2019/0267429 A1 Aug. 29, 2019

(30) Foreign Application Priority Data
Feb. 27, 2018 (KR) ........................ 10-2018-0023655

(51) Int. Cl.
*H01L 27/30* (2006.01)
*H01L 51/44* (2006.01)
*H01L 27/28* (2006.01)

(52) U.S. Cl.
CPC .......... *H01L 27/307* (2013.01); *H01L 27/281* (2013.01); *H01L 27/286* (2013.01); *H01L 51/441* (2013.01)

(58) Field of Classification Search
CPC ......... H01L 27/14605; H01L 27/14643; H01L 27/307; H01L 27/28
See application file for complete search history.

(56) References Cited

U.S. PATENT DOCUMENTS

| | | |
|---|---|---|
| 9,620,548 B1 | 4/2017 | Wang et al. |
| 9,780,130 B2 | 10/2017 | Suh et al. |
| 9,780,142 B1 | 10/2017 | Koo et al. |
| 10,212,367 B2 * | 2/2019 | Lee .................. H04N 5/332 |
| 2014/0213011 A1 | 7/2014 | Lee |
| 2015/0312492 A1 | 10/2015 | Kim |
| 2016/0293873 A1 | 10/2016 | Yamaguchi |
| 2017/0148838 A1 | 5/2017 | Togashi |

(Continued)

FOREIGN PATENT DOCUMENTS

WO    WO-2016/143531 A1    9/2016

OTHER PUBLICATIONS

Search Report and Written Opinion for corresponding Singapore Application No. 10201807945V dated Jul. 3, 2019.

*Primary Examiner* — Hsien Ming Lee
(74) *Attorney, Agent, or Firm* — Harness, Dickey & Pierce, P.L.C.

(57) ABSTRACT

An image sensor includes a substrate which includes a first surface and a light-incident second surface facing the first surface, a first semiconductor photoelectric conversion element inside the substrate, an organic photoelectric conversion element on the second surface of the substrate, a first floating diffusion region on the first surface of the substrate, a first transfer transistor having a first end connected to the first semiconductor photoelectric conversion element and a second end connected to the first floating diffusion region, and a second transfer transistor having a first end connected to the organic photoelectric conversion element and a second end connected to the first floating diffusion region. The first semiconductor photoelectric conversion element, the first floating diffusion region, and the first transfer transistor and the second transfer transistor may be in a first pixel region of the substrate.

20 Claims, 17 Drawing Sheets

(56) References Cited

U.S. PATENT DOCUMENTS

| | | |
|---|---|---|
| 2017/0170238 A1 | 6/2017 | Lee et al. |
| 2017/0170239 A1 | 6/2017 | Lee et al. |
| 2017/0287982 A1 | 10/2017 | Joei |
| 2018/0013961 A1 | 1/2018 | Lee et al. |
| 2018/0190707 A1* | 7/2018 | Lee .................. H01L 27/14645 |
| 2018/0240847 A1 | 8/2018 | Ota et al. |

* cited by examiner

IMAGE SENSORS

CROSS-REFERENCE TO RELATED APPLICATIONS

This application claims the benefit under 35 U.S.C. § 119 of Korean Patent Application No. 10-2018-0023655, filed on Feb. 27, 2018 in the Korean Intellectual Property Office, the disclosure of which is incorporated herein in its entirety by reference.

BACKGROUND

1. Field of the Inventive Concepts

The present inventive concepts relate to image sensors.

2. Description of the Related Art

An image sensor may include an element of a semiconductor device that is configured to convert optical information into an electrical signal. Such an image sensor may include a CCD (charge coupled device) image sensor and a CMOS (complementary metal-oxide semiconductor) image sensor. With higher integration of semiconductor devices, image sensors are also highly integrated.

SUMMARY

Some example embodiments provide a shared structure in which at least one pixel region forms one unit pixel region and at least one pixel region shares the pixel transistors, where the pixel region of the unit pixel region may include a semiconductor photoelectric conversion element, and the unit pixel region may share the organic photoelectric conversion element, and transfer transistors corresponding to each of the semiconductor photoelectric conversion element and the organic photoelectric conversion element may be formed in a unit pixel region.

Some example embodiments provide an image sensor in which transfer transistors corresponding to each of the organic photoelectric conversion element and the semiconductor photoelectric conversion element are disposed in a pixel region so that each transfer transistor shares a floating diffusion region, thereby improving the degree of integration.

Some example embodiments provide an image sensor capable of simplifying the process, by simultaneously forming a contact of a penetration electrode connected to the organic photoelectric conversion element and a contact of the transfer transistor.

The example embodiments are not limited to those mentioned above and some example embodiments which are not expressly described above may be clearly understood by those skilled in the art from the description below.

According to some example embodiments, an image sensor may include a substrate, a first semiconductor photoelectric conversion element, an organic photoelectric conversion element, a first floating diffusion region, a first transfer transistor, and a second transfer transistor. The substrate may include a unit pixel region. The unit pixel region may include a pixel transistor formation region and at least one pixel region. The substrate may include a first surface and a second surface. The first surface and the second surface may face each other. The second surface may be configured to be a light-incident surface. The first semiconductor photoelectric conversion element may be inside the substrate such that the first semiconductor photoelectric conversion element is at least partially enclosed by the substrate. The organic photoelectric conversion element may be on the second surface of the substrate. The first floating diffusion region may be on the first surface of the substrate. The first transfer transistor may have a first end connected to the first semiconductor photoelectric conversion element and a second end connected to the first floating diffusion region. The second transfer transistor may have a first end connected to the organic photoelectric conversion element and a second end connected to the first floating diffusion region. The at least one pixel region may include a first pixel region, and the first semiconductor photoelectric conversion element, the first floating diffusion region, and the first transfer transistor and the second transfer transistor may be in the first pixel region.

According to some example embodiments, an image sensor may include a substrate, the substrate including a first surface and a second surface, the first surface and the second surface facing each other, the second surface configured to be a light-incident surface. The image sensor may include a first semiconductor photoelectric conversion element inside the substrate such that the first semiconductor photoelectric conversion element is at least partially enclosed by the substrate. The image sensor may include an organic photoelectric conversion element on the second surface of the substrate. The image sensor may include a first floating diffusion region on the first surface of the substrate. The image sensor may include a first penetration electrode configured to electrically connect the organic photoelectric conversion element with the first floating diffusion region, the first penetration electrode including at least a first portion and a second portion, the first portion of the first penetration electrode penetrating the substrate. The image sensor may include a first contact extending from the first surface of the substrate in a first direction, the first contact including a first surface and a second surface, the second surface of the first contact facing the first surface of the first contact, the second surface of the first contact is in contact with the first penetration electrode. The image sensor may include a second contact extending from the first surface of the substrate in the first direction, the second contact including a third surface and a fourth surface, the fourth surface facing the third surface, the fourth surface in contact with the first floating diffusion region. The first direction may be a direction from the second surface of the substrate toward the first surface of the substrate. The first surface of the first contact and the third surface of the second contact may be substantially coplanar.

According to some example embodiments, an image sensor may include a substrate including a first surface and a second surface, the first surface and the second surface facing each other, the second surface configured to be a light-incident surface. The image sensor may include a first semiconductor photoelectric conversion element inside the substrate such that the first semiconductor photoelectric conversion element is at least partially enclosed by the substrate. The image sensor may include an organic photoelectric conversion element on the second surface of the substrate. The image sensor may include a first floating diffusion region on the first surface of the substrate. The image sensor may include a first transfer gate which is on the first surface of the substrate and configured to transfer a first electric charge to the first floating diffusion region, the first electric charge generated by the first semiconductor photoelectric conversion element. The image sensor may include a first penetration electrode connected to the organic photoelectric conversion element, the first penetration electrode including at least a first portion and a second portion, the first portion of the first penetration electrode extending from the first surface of the substrate to the second surface of the substrate. The image sensor may include a second transfer gate on the first surface of the substrate and configured to transfer a second electric charge to the first floating diffusion region, using the first penetration electrode, the second electric charge generated by the organic photoelectric conversion element.

According to some example embodiments, a method for manufacturing an image sensor may include forming a trench on a first surface of a substrate, such that the trench extends into an interior of the substrate, forming an insulating film that extends along a side surface and a bottom surface of the trench, forming a pre penetration electrode on the insulating film to fill a remainder of the trench that is not filled by the insulating film, forming a semiconductor photoelectric conversion element inside the substrate so as to be spaced apart from the pre penetration electrode, forming a floating diffusion region on the first surface of the substrate so as to be spaced apart from the pre penetration electrode, forming a first transfer gate on a first side of the floating diffusion region on the first surface of the substrate, forming a second transfer gate on a second side of the floating diffusion region facing the first side on the first surface of the substrate between the pre penetration electrode and the floating diffusion region, forming an etch stop film on the first surface of the substrate, such that the etch stop film covers the first transfer gate, the second transfer gate, an upper surface of the floating diffusion region and an upper surface of the pre penetration electrode, forming an interlayer insulating film on the etch stop film, forming a first contact hole which penetrates the interlayer insulating film and the etch stop film to expose the pre penetration electrode, and forming a second contact hole which penetrates the interlayer insulating film and the etch stop film to expose the floating diffusion region. The upper surfaces of the first contact hole and the second contact hole may be substantially coplanar.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF THE EMBODIMENTS

Hereinafter, an image sensor according to some example embodiments of the present inventive concepts will be described with reference to FIGS. 1 to 2.

Figure 1:
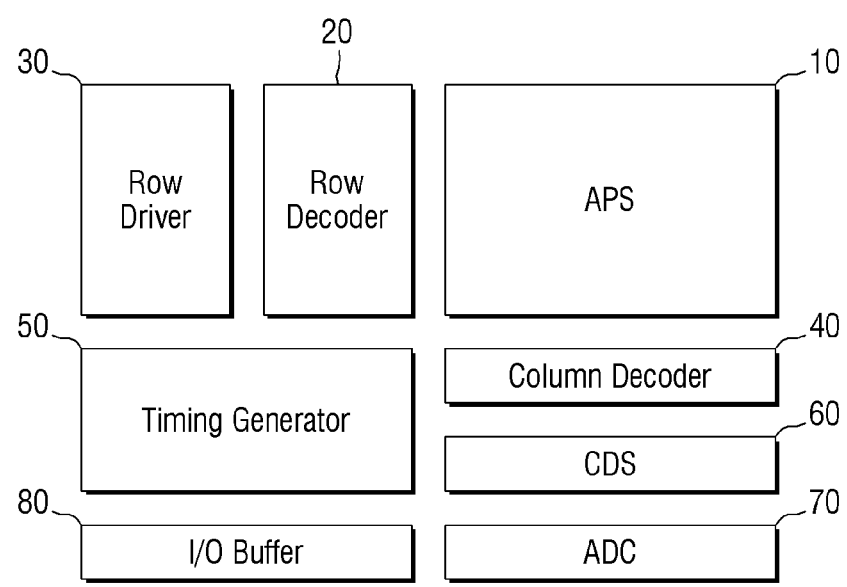
FIG. 1 is a block diagram of an image sensor according to some example embodiments of the present inventive concepts.

FIG. 1 is a block diagram of the image sensor according to some example embodiments of the present inventive concepts. FIG. 2 is a diagram of a substrate 100 of the image sensor according to some example embodiments of the present inventive concepts.

Referring to FIG. 1, the image sensor according to some example embodiments includes an active pixel sensor array 10, a row decoder 20, a row driver 30, a column decoder 40, a timing generator 50, a correlated double sampler (CDS) 60, an analog-to-digital converter (ADC) 70, and an input/output buffer (I/O buffer) 80.

The active pixel sensor array 10 includes a plurality of unit pixel regions two-dimensionally arranged, and may convert an optical signal into an electric signal. The active pixel sensor array 10 may be driven by a plurality of drive signals, such as pixel selection signals, reset signals, and charge transfer signals, from the row driver 30. In some example embodiments, the electrical signal converted by the active pixel sensor array 10 may be provided to the correlated double sampler (CDS) 60.

The row driver 30 may provide a large number of driving signals for driving the plurality of unit pixel regions in accordance with the result decoded by the row decoder 20 to the active pixel sensor array 10. When the unit pixel regions are disposed in a matrix form, a drive signal can be provided for each row. The timing generator 50 may provide a timing signal and a control signal to the row decoder 20 and the column decoder 40. The correlated double sampler (CDS) 60 may receive the electrical signal generated by the active pixel sensor array 10, and may hold and sample the electrical signal. The correlated double sampler (CDS) 60 may doubly sample a specific noise level and a signal level of the electric signal, and may output a difference level corresponding to a difference between the noise level and the signal level.

The analog-to-digital converter (ADC) 70 may convert the analog signal corresponding to the difference level, which is output from the correlated double sampler (CDS) 60, into a digital signal and output the digital signal. The input/output buffer (I/O buffer) 80 latches the digital signal, and the latched signal may sequentially output a digital signal to a video signal processing unit (not illustrated) in accordance with the decoding result from the column decoder 40.

Figure 2:
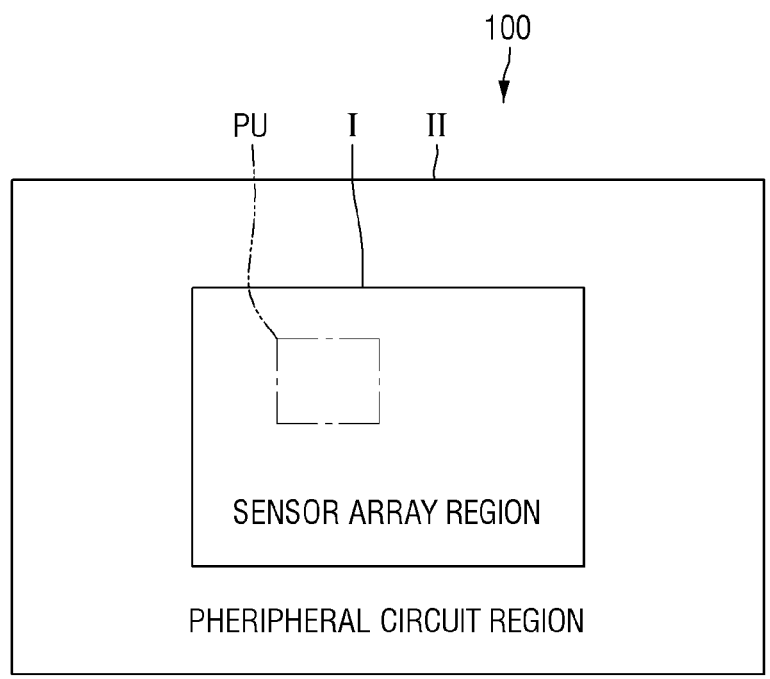
FIG. 2 is a diagram of a substrate of an image sensor according to some example embodiments of the present inventive concepts.

Referring to FIG. 2, a peripheral circuit region II may be, for example, a region in which the correlated double sampler (CDS) 60, the analog-to-digital converter (ADC) 70 and the like of FIG. 1 are formed.

A sensor array region I may be, for example, a region in which the active pixel sensor array 10 of FIG. 1 is formed. The active pixel sensor array 10 of the sensor array region I may include a plurality of unit pixel regions. The plurality of unit pixel regions may include a unit pixel region PU. In some example embodiments, the peripheral circuit region II may be formed to surround the sensor array region I, but the present inventive concepts is not limited thereto.

Hereinafter, the image sensor according to some example embodiments of the present inventive concepts will be described with reference to FIGS. 3 to 6. For the sake of clarity of explanation, repeated description will not be provided.

Figure 3:
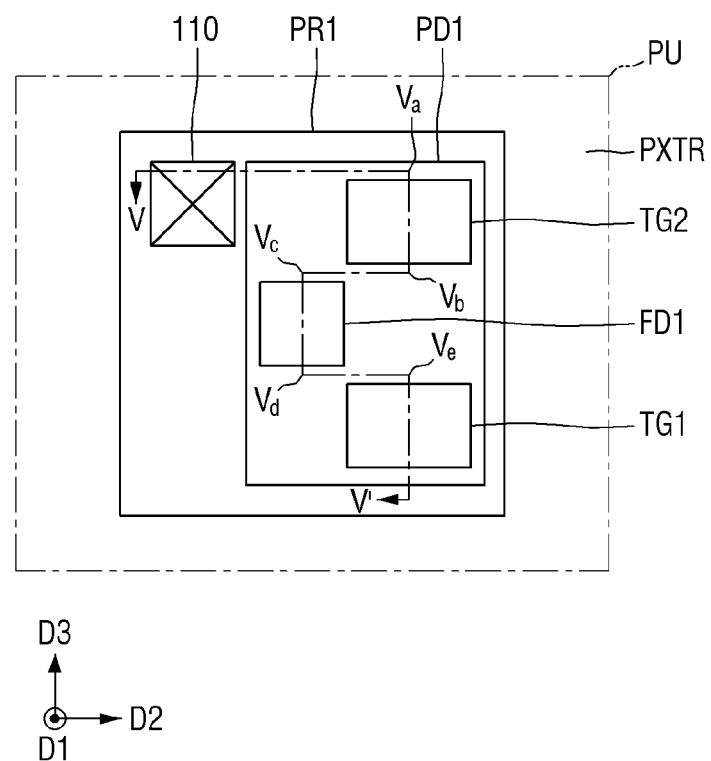
FIG. 3 is a layout diagram illustrating a unit pixel region of the image sensor according to some example embodiments of the present inventive concepts.
Figure 4:
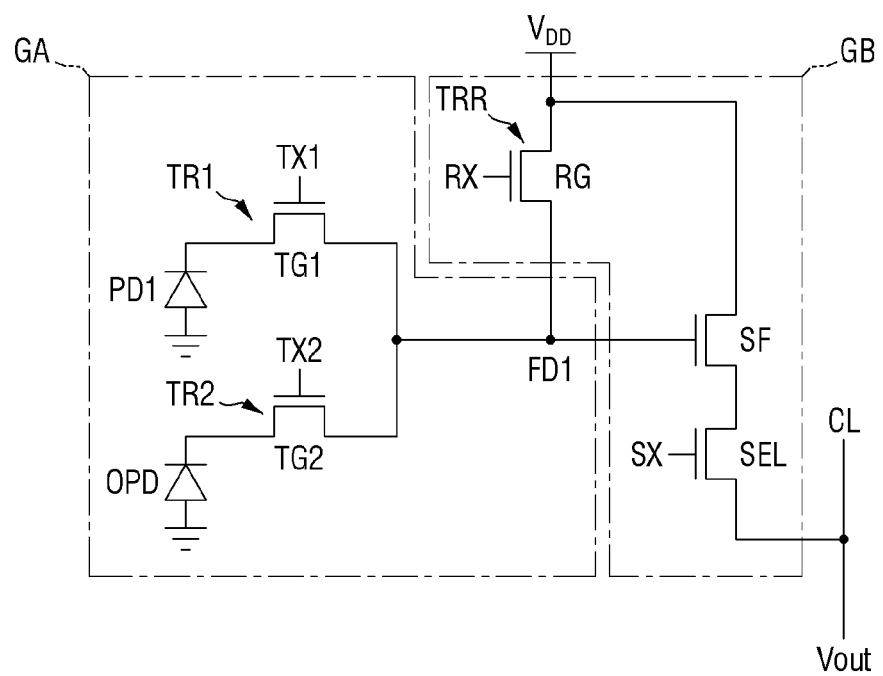
FIG. 4 is a circuit diagram of the image sensor according to some example embodiments of the present inventive concepts.

FIG. 3 is a layout diagram illustrating a unit pixel region PU of the image sensor according to some example embodiments of the present inventive concepts. FIG. 3 may be an enlarged view of a unit pixel region PU which is a partial region of the sensor array region I of FIG. 2. In FIG. 3, an organic photoelectric conversion element, a pixel transistor, a contact and a wiring are not illustrated for clarity of description. FIG. 4 is a circuit diagram of the image sensor according to some example embodiments of the present inventive concepts. FIG. 4 may be a circuit diagram corresponding to the layout of FIG. 3.

Referring to FIGS. 3 and 4, the image sensor according to some example embodiments of the present inventive concepts may include a substrate (100 of FIG. 2) including the unit pixel region PU. The unit pixel region PU may include a pixel transistor formation region PXTR and at least one pixel region. In some example embodiments, the unit pixel region PU may include a first pixel region PR1. The pixel transistor formation region PXTR may surround the periphery of the first pixel region PR1.

The unit pixel region PU may include, for example, a first semiconductor photoelectric conversion element PD1, an organic photoelectric conversion element OPD, first and second transfer transistors TR1 and TR2, a first floating diffusion region FD1, a reset transistor TRR, a source follower transistor SF, and a selection transistor SEL.

The gate of the first transfer transistor TR1 may be a first transfer gate TG1, and the gate of the second transfer transistor TR2 may be a second transfer gate TG2. In some example embodiments, the gate of the reset transistor TRR may be a reset gate RG.

The first semiconductor photoelectric conversion element PD1, the organic photoelectric conversion element OPD, the first transfer gate TG1, the second transfer gate TG2, and the first floating diffusion region FD1 may form a first group GA. The reset gate RG, the source follower transistor SF and the selection transistor SEL may form a second group GB. In some example embodiments, the first group GA may be disposed in the first pixel region PR1, and the second group GB may be disposed in the pixel transistor formation region PXTR. In other words, the first semiconductor photoelectric conversion element PD1, the first transfer gate TG1, the second transfer gate TG2, and the first floating diffusion region FD1 may be disposed in the first pixel region PR1 of the unit pixel region PU. Further, the reset gate RG, the source follower transistor SF and the selection transistor SEL may be disposed in the pixel transistor formation region PXTR. For example, the organic photoelectric conversion element OPD may be disposed only in the first pixel region PR1, and may be disposed over the first pixel region PR1 and the pixel transistor formation region PXTR. The reset transistor TRR and the source follower transistor SF may be in the pixel transistor formation region PXTR.

A first penetration electrode 110 may be further disposed in the first pixel region PR1. Details of the first penetration electrode 110 will be described later.

In the first pixel region PR1, the first floating diffusion region FD1 may be disposed between the first transfer gate TG1 and the second transfer gate TG2. In the first pixel region PR1, the first semiconductor photoelectric conversion element PD1 may be disposed to cover the first transfer gate TG1, the second transfer gate TG2 and the first floating diffusion region FD1. In the first pixel region PR1, the first penetration electrode 110 may be disposed so as not to overlap the first semiconductor photoelectric conversion element PD1. However, the present inventive concepts is not limited thereto. For example, the arrangement of the constituent elements in the first pixel region PR1 may of course be changed as necessary.

For example, the first semiconductor photoelectric conversion element PD1 may include a photo diode, a photo transistor, a photo gate, a pinned photo diode (PPD), and a combination thereof.

The first semiconductor photoelectric conversion element PD1 and the organic photoelectric conversion element OPD may detect light having different wavelengths. Each of the first semiconductor photoelectric conversion element PD1 and the organic photoelectric conversion element OPD receives provision of light (L of FIG. 5) through a first micro-lens (ML1 of FIG. 5) to be described later, and may generate the first and second optical signals which are optical charges, in proportion to the amount of incident light (L of FIG. 5).

As shown in FIG. 4, one end (e.g., a first end) of the first transfer transistor TR1 may be connected to the first semiconductor photoelectric conversion element PD1, and the other end (e.g., a second end) of the first transfer transistor TR1 may be connected to the first floating diffusion region FD1. The first transfer gate TG1 of the first transfer transistor TR1 may be gated by the first transfer control signal TX1. The first transfer gate TG1 may transfer a first optical signal, which is an electric charge (e.g., a first electric charge) generated by the first semiconductor photoelectric conversion element PD1, to the first floating diffusion region TG1 in accordance with the first transfer control signal TX1.

As further shown in FIG. 4, one end (e.g., a first end) of the second transfer transistor TR2 may be connected to the organic photoelectric conversion element OPD, and the other end (e.g., a second end) of the second transfer transistor TR2 may be connected to the first floating diffusion region FD1. The second transfer gate TG2 of the second transfer transistor TR2 may be gated by the second transfer control signal TX2. The second transfer gate TG2 may transfer the second optical signal, which is an electric charge (e.g., a second electric charge) generated by the organic photoelectric conversion element OPD, to the first floating diffusion region FD1 in accordance with the second transfer control signal TX2.

The first transfer transistor TR1 and the second transfer transistor TR2 may share the first floating diffusion region FD1. The first floating diffusion region FD1 receives provision of the first optical signal and/or the second optical signal and may store the first and/or second optical signal cumulatively.

One end of the reset transistor TRR may be connected to a power supply voltage $V_{DD}$, and the other end of the reset transistor TRR may be connected to the first floating diffusion region FD1. The reset gate RG of the reset transistor TRR may be gated by the reset control signal RX. The reset transistor TRR may be configured to reset the first floating diffusion region FD1 with the power supply voltage $V_{DD}$. One end of the source follower transistor SF may be connected to the power supply voltage $V_{DD}$, and the other end of the source follower transistor SF may be connected to one end of the selection transistor SEL. The source follower transistor SF may be a driving transistor which is controlled by the first floating diffusion region FD1 and is capable of generating an output voltage. As shown in FIG. 4, the source follower transistor SF may have a gate connected to the first floating diffusion region FD1. The source follower transistor SF is combined with a constant current source located outside the unit pixel and functions as a source follower buffer amplifier, and may amplify a potential change in the first floating diffusion region FD1 to generate an output voltage Vout. The output voltage Vout may be output to the selection transistor SEL. One end of the selection transistor SEL may be connected to the other end of the source follower transistor SF, and the other end of the selection transistor SEL may be connected to the column line CL. The selection transistor SEL may be gated by the selection control signal SX. The selection transistor SEL may output the output voltage Vout to the column line CL connected to the unit pixel region PU.

The first transfer control signal TX1, the second transfer control signal TX2, the reset control signal RX, and the selection control signal SX may be output from the row driver 30 of FIG. 1.

In the image sensor according to the present inventive concepts, since the first semiconductor photoelectric conversion element PD1, the first transfer gate TG1, the second transfer gate TG2, and the first floating diffusion region FD1 are disposed in the first pixel region PR1 of the unit pixel region PU, the degree of integration of the image sensor can be improved and the accuracy of the optical signal can be improved. For example, by disposing the first transfer transistor TR1 corresponding to the first semiconductor photoelectric conversion element PD1 and the second transfer transistor TR2 corresponding to the organic photoelectric conversion element OPD in the first pixel region PR1, the first and second optical signals, which are photo-charges generated from the first semiconductor photoelectric conversion element PD1 and the organic photoelectric conversion element OPD, can be accurately transmitted to the first floating diffusion region FD1. Further, in the image sensor according to the present inventive concepts, by making the first transfer transistor TR1 and the second transfer transistor TR2 share the first floating diffusion region FD1, it is possible to improve the degree of integration of the image sensor.

Figure 5:
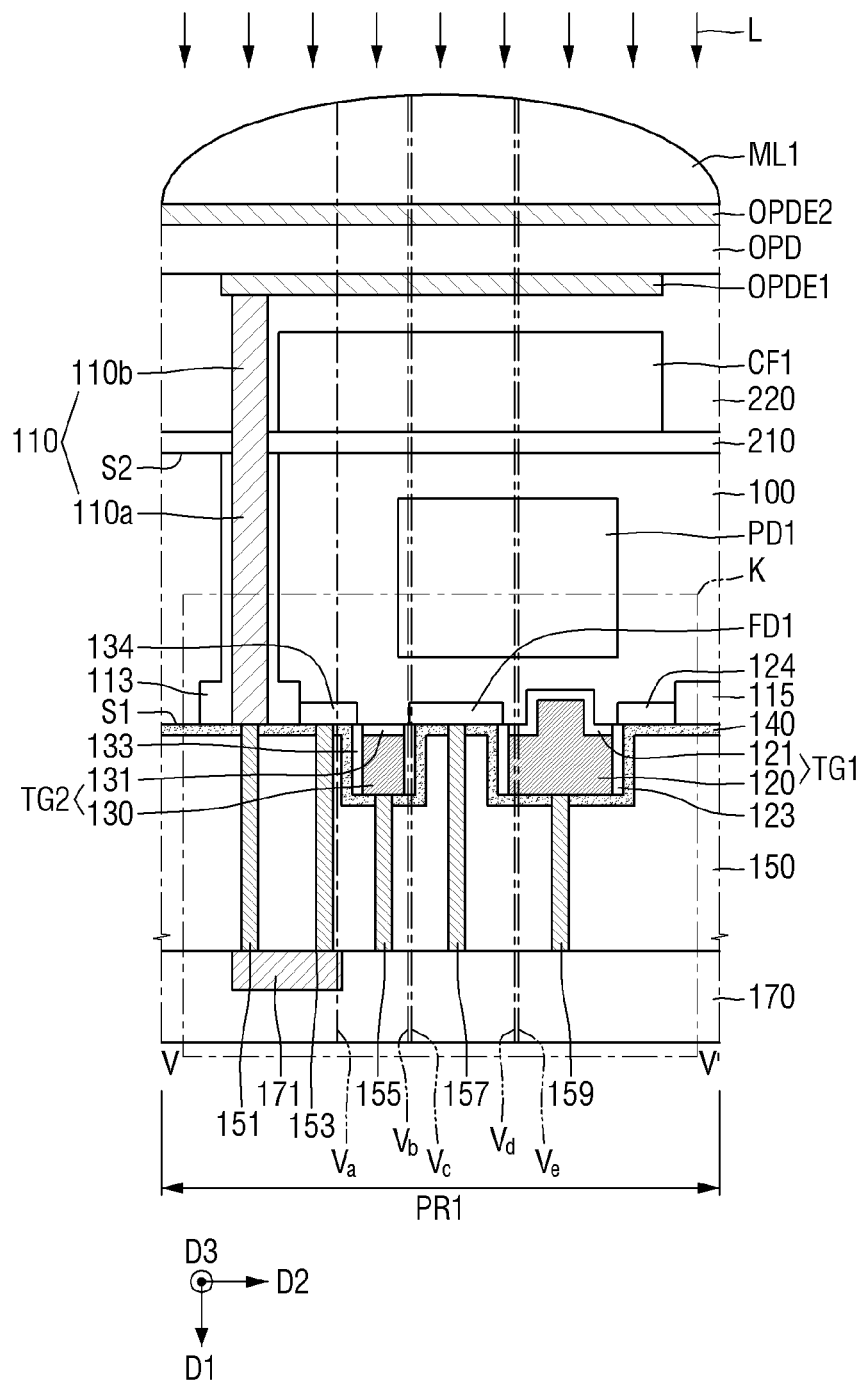
FIG. 5 is a cross-sectional view taken along the line V-V' of FIG. 3.
Figure 6:
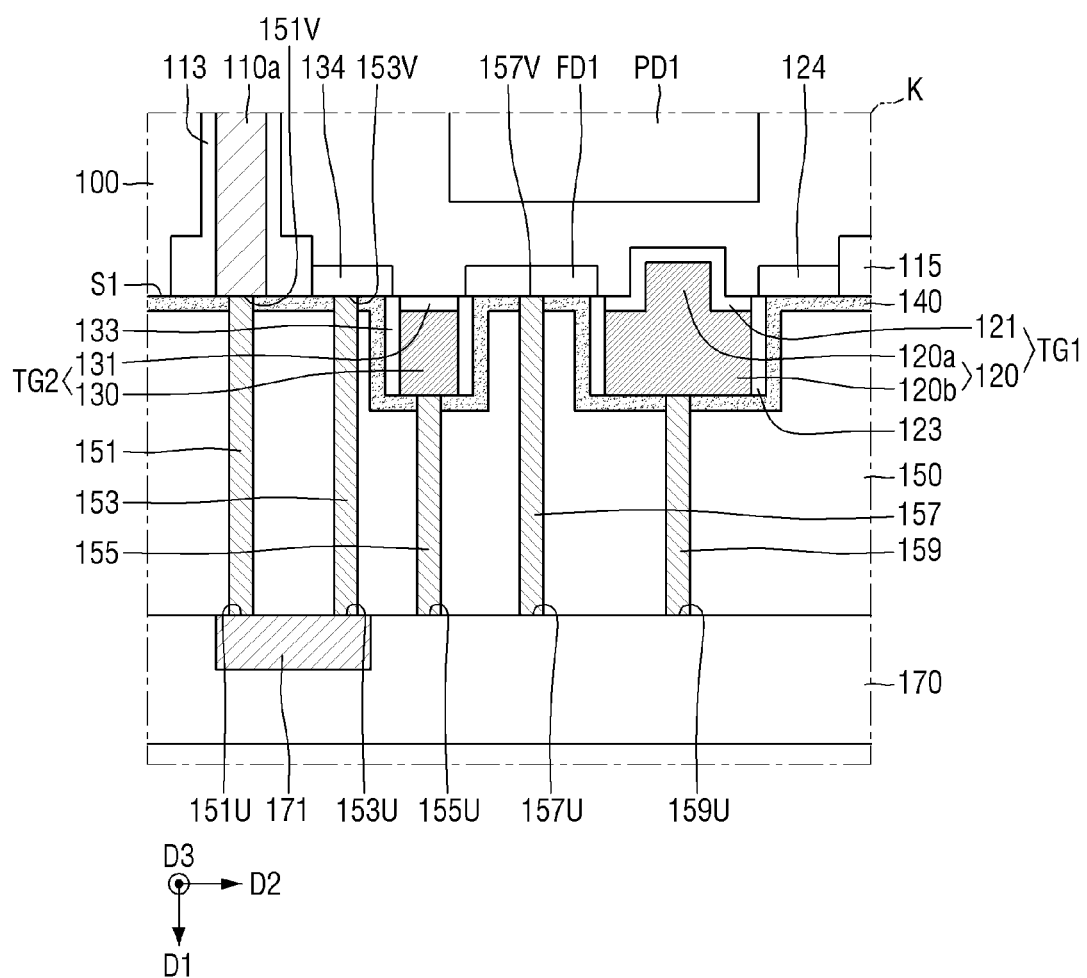
FIG. 6 is an enlarged view of a region K of FIG. 5.

FIG. 5 is a cross-sectional view taken along the line V-V' of FIG. 3. FIG. 6 is an enlarged view of a region K of FIG. 5. The layout diagram of FIG. 3 may be a layout when viewed in a direction from a first surface S1 toward a second surface S2 of the substrate 100.

Referring to FIGS. 5 and 6, the substrate 100 may include the first surface S1 and the second surface S2 facing each other. The second surface S2 of the substrate 100 may be a surface on which light L is incident (e.g., the second surface S2 is proximate, relative to the first surface S1, to an environment from which light may be received at the substrate 100, such that the second surface S2 may be understood to be, and referred to herein as, configured to be a "light-incident surface." The substrate 100 may be, for example, bulk silicon or silicon-on-insulator (SOI). Alternatively, the substrate 100 may be a silicon substrate or may contain other material, such as silicon germanium, indium antimonide, lead tellurium compound, indium arsenide, indium phosphide, gallium arsenide or gallium antimonide. In some example embodiments, the substrate 100 may have an epitaxial layer formed on the base substrate.

The first semiconductor photoelectric conversion element PD1 may be disposed inside the substrate 100 of the first pixel region PR1. As referred to herein, an element that is "inside" another element may be at least partially surrounded (e.g., "enclosed") by the other element such that the surrounded element is located within a volume defined by the outer boundaries (e.g., outer surfaces) of the other element. Thus, here, the first semiconductor photoelectric conversion element PD1 may be at least partially surrounded by the substrate 100 of the first pixel region PR1 such that the fir semiconductor photoelectric conversion element PD1 is located within a volume defined by some or all of the outer surfaces of the substrate 100. The outer surfaces of the substrate 100 may include the first and second surfaces S1 and S2 in addition to surfaces of the substrate 100 that extend between the first and second surfaces. The first semiconductor photoelectric conversion element PD1 may be formed by doping an impurity having a conductivity type opposite to that of the substrate 100 into the substrate 100. In addition, the first semiconductor photoelectric conversion element PD1 may have a difference in impurity concentration between the upper part and the lower part of the first semiconductor photoelectric conversion element PD1 so that the first semiconductor photoelectric conversion element PD1 may have a potential inclination along the first direction D1. For example, the first semiconductor photoelectric conversion element PD1 may be formed in a form in which a plurality of impurity regions is stacked. Here, the first direction D1 may be a direction extending, orthogonally to the second surface S2 of the substrate, from the second surface S2 of the substrate 100 toward the first surface S1 of the substrate 100.

The first floating diffusion region FD1 may be disposed on the first surface S1 of the substrate 100 of the first pixel region PR1. For example, the first floating diffusion region FD1 may be disposed inside the substrate 100 on the first surface S1 side of the substrate 100, such that the first floating diffusion region FD1 is at least partially enclosed by the substrate 100, as shown for example in FIG. 5.

As referred to herein, an element that is "on" another element may be understood to be above and/or beneath the other element. Additionally, an element that is "on" another element may be "directly on" (e.g., in direct contact with) the other element and/or may be "indirectly on" the other element (e.g., spaced apart from the other element such that an interposing element and/or space is between proximate surfaces of the element and other element).

The first transfer transistor TR1 and the second transfer transistor TR2 may be disposed on the first surface S1 of the substrate 100. The first transfer gate TG1 of the first transfer transistor TR1 and the second transfer gate TG2 of the second transfer transistor TR2 may be disposed on the first surface S1 of the substrate 100. The first transfer gate TG1 and the second transfer gate TG2 may be disposed on both sides of the first floating diffusion region FD1 with the first floating diffusion region FD1 as the center.

A source region 124 of the first transfer transistor TR1 may be disposed on one side of the first transfer gate TG1. The source region 124 of the first transfer transistor TR1 may be disposed inside the substrate 100 on the first surface S1 of the substrate 100. A drain region of the first transfer transistor TR1 may be the first floating diffusion region FD1. The source region 134 of the second transfer transistor TR2 may be disposed on the other side of the second transfer gate TG2. The source region 134 of the second transfer transistor TR2 may be disposed inside the substrate 100 on the first surface S1 of the substrate 100. The drain region of the second transfer transistor TR2 may be the first floating diffusion region FD1.

The first transfer gate TG1 may include a first transfer gate electrode 120 and a first transfer gate insulating film 121. The second transfer gate TG2 may include a second transfer gate electrode 130 and a second transfer gate insulating film 131.

In some example embodiments, the first transfer gate electrode 120 may include a first portion 120a and a second portion 120b. The first portion 120a of the first transfer gate electrode may be disposed inside the substrate 100 on the first surface S1 of the substrate 100. In other words, the first portion 120a of the first transfer gate electrode may be buried inside the substrate 100. The first portion 120a of the first transfer gate electrode may extend in a direction from the first surface S1 of the substrate 100 toward the second surface S2 of the substrate 100. The first portion 120a of the first transfer gate electrode may be disposed on the second portion 120b of the first transfer gate electrode. The second portion 120b of the first transfer gate electrode may protrude from the first surface S1 of the substrate 100 in the first direction D1.

In some example embodiments, the width of the first portion 120a of the first transfer gate electrode may be smaller than the width of the second portion 120b of the first transfer gate electrode. Each of the width of the first portion 120a of the first transfer gate electrode and the width of the second portion 120b of the first transfer gate electrode may be values measured in the second direction D2, respectively. However, the present inventive concepts is not limited thereto. For example, it is a matter of course that the width of the first portion 120a of the first transfer gate electrode and the width of the second portion 120b of the first transfer gate electrode may be substantially the same.

The second transfer gate electrode 130 may be disposed to extend from the first surface S1 of the substrate 100 in the first direction D1.

The first transfer gate electrode 120 and the second transfer gate electrode 130 may include, for example, a conductive material. Examples of these conductive materials may include, but are not limited to, doped polysilicon, titanium nitride (TiN), tantalum nitride (TaN), tungsten nitride (WN), titanium (Ti), tantalum (Ta) and tungsten (W).

The first transfer gate insulating film 121 may be interposed between the first transfer gate electrode 120 and the substrate 100. For example, the first transfer gate insulating film 121 may be disposed between the second portion 120b of the first transfer gate electrode and the first surface S1 of the substrate 100, and may be disposed between the sidewall of the first portion 120a of the first transfer gate electrode and the substrate 100. The first transfer gate insulating film 121 may be disposed between the bottom surface of the first portion 120a of the first transfer gate electrode and the substrate 100. The second transfer gate insulating film 131 may be interposed between the second transfer gate electrode 130 and the first surface S1 of the substrate 100.

The first transfer gate insulating film 121 and the second transfer gate insulating film 131 may include, for example, a high dielectric constant (high-K) material. The high dielectric constant material may be used, but is not limited to, including, for example, hafnium oxide, hafnium silicon oxide, lanthanum oxide, lanthanum aluminum oxide, and the like. For example, the first transfer gate insulating film 121 and the second transfer gate insulating film 131 may include a silicon oxide film, a silicon nitride film, a silicon oxynitride film, or the like.

The first transfer gate spacer 123 may be disposed on both sides of the first transfer gate TG1. For example, the first transfer gate spacer 123 may not extend into the interior of the substrate 100. In other words, the first transfer gate spacer 123 may be disposed on both sides of the second portion 120b of the first transfer gate electrode. The first transfer gate spacer 123 may extend to the first surface S1 of the substrate 100. The second transfer gate spacer 133 may be disposed on both sides of the second transfer gate TG2. The second transfer gate spacer 133 may extend to the first surface S1 of the substrate 100.

The first transfer gate spacer 123 and the second transfer gate spacer 133 may include, for example, at least one of silicon nitride (SiN), silicon oxynitride (SiON), silicon oxide ($SiO_2$), silicon oxycarbonitride (SiOCN), and combinations thereof.

A first element isolation film 115 may be disposed inside the substrate 100 on the first surface S1 of the substrate 100. The first element isolation film 115 may insulate the first transfer transistor TR1 from other constituent elements. The first element isolation film 115 may include an insulating material.

A protective planarization film 210 may be disposed on the second surface S2 of the substrate 100. The protective planarization film 210 may be a high concentration impurity layer, and may be formed by doping P type impurities such as boron B. However, the present inventive concepts is not limited thereto, and the protective planarization film 210 may be formed of an oxide film or the like having a negative charge. The protective planarization film 210 may prevent dangling-bond defects of silicon, a surface defect caused by etching stress, or the like, or occurrence of depletion well caused by decline of electric potential on a surface adjacent to the substrate 100 due to an interface trap. In addition, the protective planarization film 210 may provide a potential inclination so that the optical charges generated in the portion adjacent to the substrate 100 can flow into the first floating diffusion region FD1.

The first interlayer insulating film 220 may be disposed on the protective planarization film 210. The first interlayer insulating film 220 may be formed of an insulating material.

The first color filter CF1 may be disposed inside the first interlayer insulating film 220 on the protective planarization film 210. The first color filter CF1 may be disposed between the first semiconductor photoelectric conversion element PD1 and the organic photoelectric conversion element OPD. The first color filter CF1 may allow only light of a specific wavelength band among the incident light L to pass. For example, the first color filter CF1 may allow a wavelength band which is not converted into an electric signal by the organic photoelectric conversion element OPD among the incident light L to pass.

While at least FIG. 5 and FIG. 8, described further below, illustrate that the first color filter CF1 may be between the first semiconductor photoelectric conversion element PD1 and the organic photoelectric conversion element OPD, it will be understood that, in some example embodiments, the first color filter CF1 may be distal from the first semiconductor photoelectric conversion element PD1, relative to the organic photoelectric conversion element OPD, such that the organic photoelectric conversion element OPD is between the first semiconductor photoelectric conversion element PD1 and the first color filter CF1.

The organic photoelectric conversion element OPD may be disposed on the second surface S2 of the substrate 100. The organic photoelectric conversion element OPD may be disposed on the first interlayer insulating film 220. In the organic photoelectric conversion element OPD, for example, the organic photoelectric conversion element OPD reacts with the green light among the light incident through the first micro-lens ML1, and may convert the green light into an electric signal. The organic photoelectric conversion element OPD may include, for example, a non-silicon material such as an organic semiconductor, a quantum dot, and a chalcogenide, or an amorphous silicon (a-Si) material.

The first electrode OPDE1 may be disposed below the organic photoelectric conversion element OPD. The first electrode OPDE1 may be disposed in the first interlayer insulating film 220 of the first pixel region PR1. The second electrode OPDE2 may be disposed on the organic photoelectric conversion element OPD. For example, voltages of different levels may be applied to the first electrode OPDE1 and the second electrode OPDE2. The first micro-lens ML1 may be disposed on the second electrode OPDE2 in the first pixel region PR1. The first micro-lens ML1 may have a convex shape and may have a predetermined curvature radius. The first micro-lens ML1 may be formed of a light transmitting resin. The first micro-lens ML1 may condense the light L in the first pixel region PR1.

As shown in FIG. 5, the first penetration electrode 110 extends from the first surface S1 of the substrate 100 to the first electrode OPDE1 and may be connected to the organic photoelectric conversion element OPD. The first penetration electrode 110 may include a first portion 110a and a second portion 110b. As shown in FIG. 5, the first portion 110a of the first penetration electrode extends from the first surface S1 of the substrate 100 to the second surface S2 of the substrate 100 and may pass through the inside of the substrate 100. The second portion 110b of the first penetration electrode may pass through the protective planarization film 210 and the first interlayer insulating film 220 from the second surface S2 of the substrate 100 to come into contact with the first electrode OPDE1. The first surface S1 of the substrate 100 may expose the first penetration electrode 110. The first penetration electrode 110 may electrically connect (e.g., may be configured to electrically connect) the first floating diffusion region FD1 and the organic photoelectric conversion element OPD. Details thereof will be described later. As shown in FIG. 5, the first penetration electrode 110 may be in the first pixel region PR1.

FIG. 5 illustrates a configuration in which the sidewall of the first penetration electrode 110 has a vertical inclination with respect to the first surface S1 of the substrate 100, but the present inventive concepts is not limited thereto. For example, it is a matter of course that the sidewall of the first penetration electrode 110 may have an inclination of an arbitrary angle with respect to the first surface S1 of the substrate 100. In addition, the inclination of the sidewall of the first portion 110a of the first penetration electrode and the inclination of the sidewall of the second portion 110b of the first penetration electrode may be different from each other with reference to the first surface S1 of the substrate 100.

The first penetration electrode 110 may include, for example, a conductive material. For example, the first penetration electrode 110 may include any of tungsten, aluminum, copper, and doped silicon. Alternatively, for example, the first penetration electrode 110 may also include a combined material of the metal material and doped silicon.

The first portion 110a of the first penetration electrode may be surrounded by the first insulating film 113. In other words, the first insulating film 113 may be interposed between the first portion 110a of the first penetration electrode and the substrate 100. The first insulating film 113 may include an insulating material. The second portion 110b of the first penetration electrode may be surrounded by the first interlayer insulating film 220.

Although FIG. 5 illustrates a configuration in which the width of the portion of the first insulating film 113 adjacent to the first surface S1 of the substrate 100 is different from the width of the portion of the first insulating film 113 adjacent to the second surface S2 of the substrate 100, the present inventive concepts is not limited thereto. For example, it is a matter of course that the shape of the first insulating film 113 may be variously modified depending on the manufacturing process of the image sensor.

The first etch stop film 140 may be disposed below ("on") the first surface S1 of the substrate 100 of the first pixel region PR1. The first etch stop film 140 may be disposed to cover the lower surface of the first penetration electrode 110, and the lower surfaces of the first transfer gate TG1, the second transfer gate TG2 and the first floating diffusion region FD1. Accordingly, the first etch stop film 140 may cover the first penetration electrode 110, the first transfer transistor TR1, the second transfer transistor TR2, and the first floating diffusion region FD1. Here, the lower surface of the first penetration electrode 110 may be a portion of the first penetration electrode 110 exposed by the first surface S1 of the substrate 100. In addition, the lower surface of the first floating diffusion region FD1 may be a portion of the first floating diffusion region FD1 exposed by the first surface S1 of the substrate 100. Specifically, the first etch stop film 140 may cover the first insulating film 113, the lower surface of the first penetration electrode 110, the source region 134 of the second transfer transistor TR2, the sidewall of the second transfer gate spacer 133, the second transfer gate electrode 130, the first floating diffusion region FD1, the sidewall of the first transfer gate spacer 123, the first transfer gate electrode 120, and the source region 124 of the first transfer transistor TR1. The first etch stop film 140 may include, for example, silicon nitride (SiN).

The second interlayer insulating film 150 may be disposed below the first etch stop film 140. The third interlayer insulating film 170 may be disposed below the second interlayer insulating film 150. The second interlayer insulating film 150 and the third interlayer insulating film 170 may be formed of an insulating material. For example, the second interlayer insulating film 150 and the third interlayer insulating film 170 may be formed of HDP (High Density Plasma), TOSZ (Tonen SilaZene), SOG (Spin On Glass), USG (Undoped Silica Glass) or the like. However, the present inventive concepts is not limited thereto.

The first, second, third, fourth and fifth contacts 151, 153, 155, 157, and 159 may be disposed to be spaced part from each other in the second interlayer insulating film 150. Each of the first to fifth contacts 151, 153, 155, 157, and 159 may extend from the first surface S1 of the substrate 100 in the first direction D1.

The first contact 151 may penetrate through the second interlayer insulating film 150 and the first etch stop film 140 and make contact with the first penetration electrode 110. Thus, as shown in FIGS. 5-6, the first contact 151 may extend from the first surface S1 of the substrate 100 in a first direction (e.g., D1). The first contact 151 may include a first surface 151U, and a second surface 151V that faces the first surface 151U, where the second surface 151V is in contact with the first penetration electrode 110. The second contact 153 may penetrate through the second interlayer insulating film 150 and the first etch stop film 140 and make contact with the source region 134 of the second transfer transistor TR2. Thus, as shown in FIGS. 5-6, the second contact 153 may extend from the first surface S1 of the substrate 100 in the first direction (e.g., D1). The second contact 153 may include a first surface 153U (also referred to herein as a third surface), and a second surface 153V (also referred to herein as a fourth surface) which faces the first surface 153U and is in contact with the source region 134 of the second transfer transistor TR2. The third contact 155 may penetrate through the second interlayer insulating film 150 and the first etch stop film 140 and make contact with the second transfer gate electrode 130. Thus, as shown in FIGS. 5-6, the first contact 151 and the second contact 153 may penetrate the first etch stop film 140. The third contact 155 may include a first surface 155U, and a second surface which faces the first surface 155U and makes contact with the second transfer gate TG2. The fourth contact 157 may penetrate the second interlayer insulating film 150 and the first etch stop film 140 and make contact with the first floating diffusion region FD1. The fourth contact 157 may include a first surface 157U, and a second surface 157V which faces the first surface 157U and is in contact with the first floating diffusion region FD1. The fifth contact 159 may penetrate through the second interlayer insulating film 150 and the first etch stop film 140 and make contact with the first transfer gate electrode 120. The fifth contact 159 may include a first surface 159U, and a second surface which faces the first surface 159U and is in contact with the first transfer gate TG1.

In some example embodiments, the first surfaces 151U, 153U, 155U, 157U, and 159U of the first to fifth contacts may be located or substantially located on the same plane (e.g., may be coplanar or substantially coplanar). For example, the first surface 151U of the first contact 151 and the first surface 153U of the second contact 153 may be coplanar or substantially coplanar. Elements that are "substantially" coplanar will be understood herein to be coplanar within manufacturing tolerances and/or material tolerances. In other words, the first surfaces 151U, 153U, 155U, 157U, and 159U of the first to fifth contacts may be located at the same height with reference to the first surface S1 of the substrate 100. The first surfaces 151U, 153U, 155U, 157U, and 159U of the first to fifth contacts may be located on the same plane as the boundary between the second interlayer insulating film 150 and the third interlayer insulating film 170.

In the image sensor according to the present inventive concepts, since the first surface 151U of the first contact is located on the same plane as the first surfaces 153U, 155U, 157U, and 159U of the second to fifth contacts, it is possible to simplify the manufacturing process of the image sensor. For example, the first to fifth contacts 151, 153, 155, 157, and 159 may be formed at the same level. Here, "the same level" means to be formed by the same manufacturing process. Although it will be described later, in order to make the first surfaces 151U, 153U, 155U, 157U, and 159U locate on the same plane, after forming the second interlayer insulating film 150, the first to fifth contacts 151, 153, 155, 157, and 159 may be formed at the same time.

The first wiring 171 may be disposed in the third interlayer insulating film 170 of the first pixel region PR1. For example, the first wiring 171 may connect the first contact 151 and the second contact 153. The first wiring 171 may include a conductive material.

In some example embodiments, the organic photoelectric conversion element OPD may be electrically connected to the first floating diffusion region FD1, through the first penetration electrode 110, the first contact 151, the first wiring 171 and the second contact 153. For example, the second transfer gate TG2 may transfer the second optical signal, which is the optical charge (e.g., a second electric charge) generated by the organic photoelectric conversion element OPD, to the first floating diffusion region FD1, using the first penetration electrode 110, the first contact 151, the first wiring 171, the second contact 153, and the source region 134 of the second transfer transistor TR2.

Figure 7:
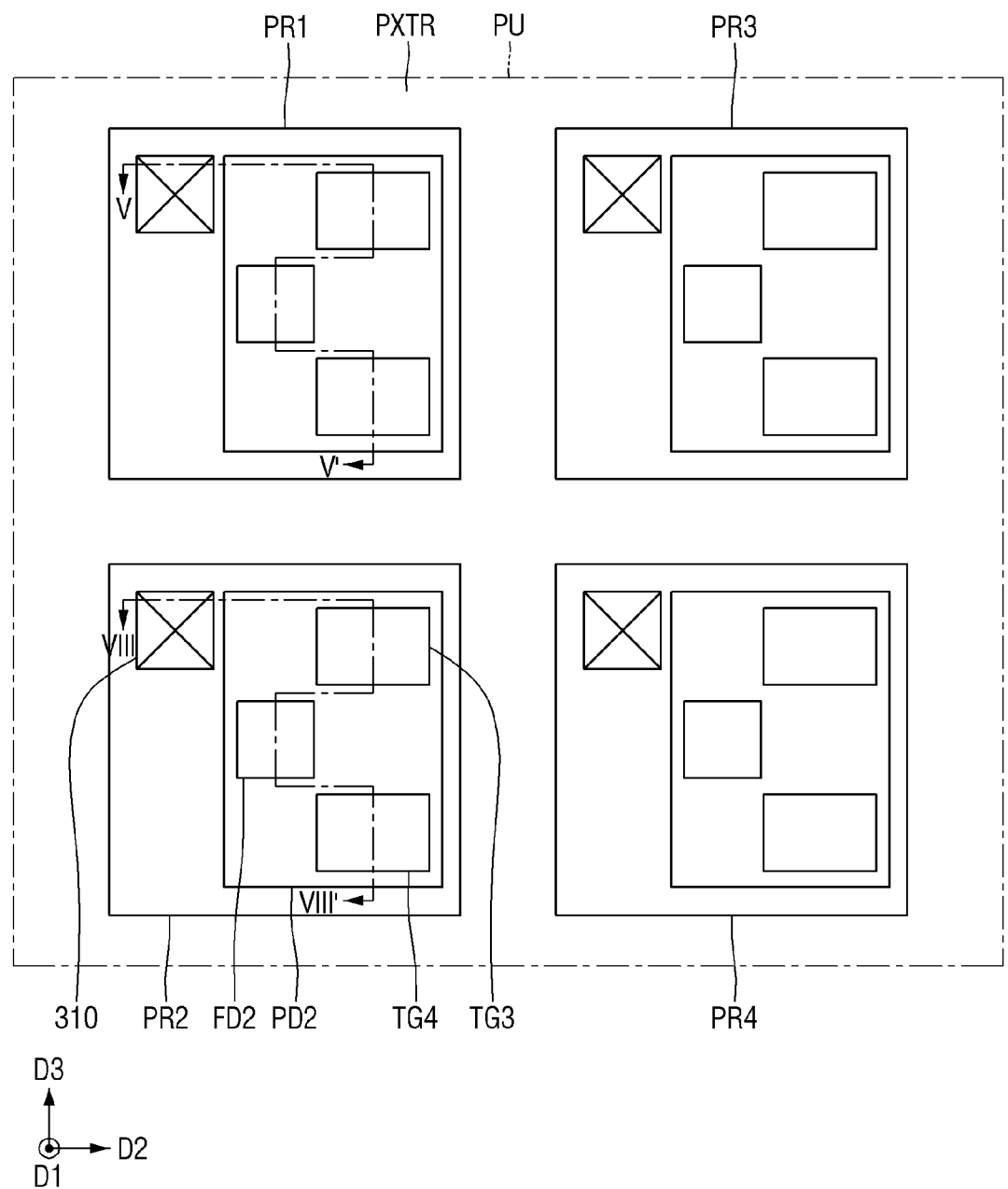
FIG. 7 is a layout diagram illustrating a unit pixel region of the image sensor according to some example embodiments of the present inventive concepts.

Hereinafter, an image sensor according to some example embodiments of the present inventive concepts will be described with reference to FIGS. 7 and 8. For the sake of clarity of explanation, repeated description will not be provided. FIG. 7 is a layout diagram for explaining a unit pixel region PU of the image sensor according to some example embodiments of the present inventive concepts. FIG. 7 may be an enlarged view of the unit pixel region PU which is a partial region of the sensor array region I of FIG. 2. In FIG. 7, for the sake of clarity of explanation, the organic photoelectric conversion element, the pixel transistor, the contact and the wiring are not illustrated. FIG. 8 is a cross-sectional view taken along line V-V' and line VIII-VIII' of FIG. 7.

Figure 8:
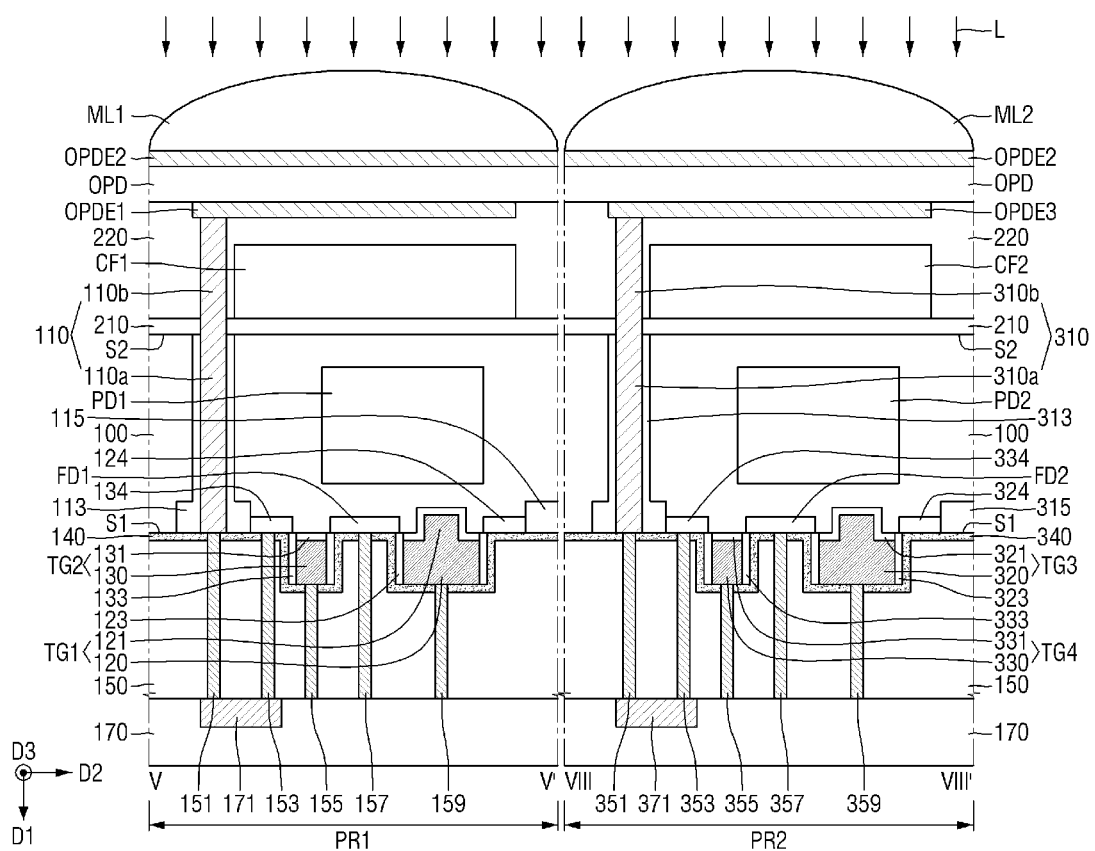
FIG. 8 is a cross-sectional view taken along line V-V' and line VIII-VIII' of FIG. 7.

Referring to FIGS. 7 and 8, the unit pixel region PU of the image sensor according to some example embodiments of the present inventive concepts may include first to fourth pixel regions PR1, PR2, PR3, and PR4. The second pixel region PR2 may be spaced apart from the first pixel region PR1 in the third direction D3. The third pixel region PR3 may be spaced apart from the first pixel region PR1 in the second direction D2. The fourth pixel region PR4 may be spaced apart from the second pixel region PR2 in the second direction D2 and may be spaced apart from the third pixel region PR3 in the third direction D3.

In the drawings, the unit pixel region PU is illustrated as including the four pixel regions, but the present inventive concepts is not limited thereto. For example, the unit pixel region PU may include at least one pixel region, and may include an arbitrary number of pixel regions as required. In addition, when the unit pixel region PU includes a plurality of pixel regions, it is a matter of course that the respective arrangements of the plurality of pixel regions may be different from the illustrated arrangement.

The pixel transistor formation region PXTR may surround the periphery of each of the first to fourth pixel regions PR1, PR2, PR3, and PR4. Each of the first to fourth pixel regions PR1, PR2, PR3, and PR4 may be the same as the first pixel region PR1 described with reference to FIGS. 3 to 6. For example, the second pixel region PR2 may include a second semiconductor photoelectric conversion element PD2, a third transfer gate TG3, a fourth transfer gate TG4, a second floating diffusion region FD2, and a second penetration electrode 310.

For example, the first to fourth pixel regions PR1, PR2, PR3, and PR4 may share the reset gate RG, the source follower transistor SF and the selection transistor SEL. In addition, the first to fourth pixel regions PR1, PR2, PR3, and PR4 may share an organic photoelectric conversion element OPD.

The organic photoelectric conversion element OPD may be disposed, for example, over the first to fourth pixel regions PR1, PR2, PR3, and PR4. In other words, the organic photoelectric conversion element OPD may overlap each of the first to fourth pixel regions PR1, PR2, PR3, and PR4.

The second semiconductor photoelectric conversion element PD2 may be disposed inside the substrate 100 of the second pixel region PR2 such that the second semiconductor photoelectric conversion element PD2 is at least partially enclosed by the substrate 100 of the second pixel region PR2 (where the substrate 100 of the second pixel region PR2 may be the same as the substrate 100 of the first pixel region PR1). The second semiconductor photoelectric conversion element PD2 may correspond to the first semiconductor photoelectric conversion element PD1. The second semiconductor photoelectric conversion element PD2 may detect light of a wavelength different from that of the first semiconductor photoelectric conversion element PD1 and the organic photoelectric conversion element OPD. The second semiconductor photoelectric conversion element PD2 may receive provision of the light L through the second microlens ML2 to generate a third optical signal which is an optical potential, in proportion to the amount of the incident light.

The second floating diffusion region FD2 may be disposed on the first surface S1 of the substrate 100 of the second pixel region PR2. For example, the second floating diffusion region FD2 may be disposed inside the substrate 100 on the first surface S1 of the substrate 100. The second floating diffusion region FD2 may correspond to the first floating diffusion region FD1.

The third transfer gate TG3 may include a third transfer gate electrode 320 and a third transfer gate insulating film 321. The third transfer gate TG3 may correspond to the first transfer gate TG1. In other words, the third transfer gate TG3 may have substantially the same shape as that of the first transfer gate TG1. In addition, the third transfer gate TG3 may include the same material as that contained in the first transfer gate TG1. The third transfer gate TG3 may be a gate of a third transfer transistor TR3.

The source region 324 of the third transfer transistor TR3 may be disposed on one side of the third transfer gate TG3. The source region 324 of the third transfer transistor TR3 may correspond to the source region 124 of the first transfer transistor TR1. The drain region of the third transistor may be a second floating diffusion region FD2. The third transfer transistor TR3 may correspond to the first transfer transistor TR1. Thus, one end (e.g., a first end) of the third transfer transistor TR3 may be connected to the second semiconductor photoelectric conversion element PD2, and the other end (e.g., a second end) of the third transfer transistor TR3 may be connected to the second floating diffusion region FD2. The third transfer transistor TR3 may be configured to transfer the third optical signal, which is an electric charge generated by the second semiconductor photoelectric conversion element PD2, to the second floating diffusion region FD2.

The fourth transfer gate TG4 may include a fourth transfer gate electrode 330 and a fourth transfer gate insulating film 331. The fourth transfer gate TG4 may have substantially the same shape as that of the second transfer gate TG2. In some example embodiments, the fourth transfer gate TG4 may include the same material as that contained in the second transfer gate TG2. The fourth transfer gate TG4 may be a gate of a fourth transfer transistor TR4.

The source region 334 of the fourth transfer transistor TR4 may be disposed on the other side of the fourth transfer gate TG4. The source region 334 of the fourth transfer transistor TR4 may be substantially the same as the source region 134 of the second transfer transistor TR2. The drain region of the fourth transistor may be a second floating diffusion region FD2. The fourth transfer transistor TR4 may correspond to the second transfer transistor TR2. Thus, one end (e.g., a first end) of the fourth transfer transistor TR4 may be connected to the organic photoelectric conversion element OPD, and the other end (e.g., a second end) of the fourth transfer transistor TR4 may be connected to the second floating diffusion region FD2. The fourth transfer transistor TR4 may transfer the fourth optical signal, which is an electric charge generated by the organic photoelectric conversion element OPD, to the second floating diffusion region FD2.

The third transfer transistor and the fourth transfer transistor TR4 may share the second floating diffusion region FD2. The second floating diffusion region FD2 may receive provision of the third optical signal and/or the fourth optical signal and store the optical signal cumulatively.

Each of the third and fourth transfer gate spacers 323 and 333 may correspond to each of the first transfer gate spacer 123 and the second transfer gate spacer 133.

The second element isolation film 315 may be disposed inside the substrate 100 on the first surface S1 of the substrate 100. The second element isolation film 315 may correspond to the first element isolation film 115.

The protective planarization film 210 and the first interlayer insulating film 220 may be disposed to cover not only the first pixel region PR1 but also the second, third and fourth pixel regions PR2, PR3, and PR4.

The second color filter CF2 may be disposed inside the first interlayer insulating film 220 on the protective planarization film 210. The second color filter CF2 may be disposed between the second semiconductor photoelectric conversion element PD2 and the organic photoelectric conversion element OPD. The second color filter CF2 may be disposed to be spaced apart from the first color filter CF1. The second color filter CF2 may allow a wavelength band, which is not converted into an electric signal by the organic photoelectric conversion element OPD among the incident light L, to pass. The second color filter CF2 and the first color filter CF1 may allow light of different wavelength bands among incident light L to pass.

While at least FIG. 8 illustrates that the second color filter CF2 may be between the second semiconductor photoelectric conversion element PD2 and the organic photoelectric conversion element OPD, it will be understood that, in some example embodiments, the second color filter CF2 may be distal from the second semiconductor photoelectric conversion element PD2, relative to the organic photoelectric conversion element OPD, such that the organic photoelectric conversion element OPD is between the second semiconductor photoelectric conversion element PD2 and the second color filter CF2.

Furthermore, because, as described above, the organic photoelectric conversion element OPD may be between the first semiconductor photoelectric conversion element PD1 and the first color filter CF1, in some example embodiments, both of the first and second color filters CF1 and CF2 may be distal from substrate 100, relative to the organic photoelectric conversion element OPD, such that the organic photoelectric conversion element OPD is between the color filters (e.g., the first and second color filters CF1 and CF2) and the semiconductor photoelectric conversion elements (e.g., the first and second semiconductor photoelectric conversion elements PD1 and PD2).

The third electrode OPDE3 may be disposed below the organic photoelectric conversion element OPD. The third electrode OPDE3 may be disposed inside the first interlayer insulating film 220 in the second pixel region PR2. The second electrode OPDE2 may be disposed on the organic photoelectric conversion element OPD not only in the first pixel region PR1 but also in the second, third and fourth pixel regions PR2, PR3, and PR4. For example, different levels of voltages may be applied to the first electrode OPDE1 and the third electrode OPDE3.

The second micro-lens ML2 may be disposed on the second electrode OPDE2 in the second pixel region PR2.

The second micro-lens ML2 may condense light L in the second pixel region PR2. The second micro-lens ML2 may correspond to the first micro-lens ML1.

The second penetration electrode 310 may include a first portion 310a and a second portion 310b. The shape of the second penetration electrode 310 may be substantially the same as that of the first penetration electrode 110. The material contained in the second penetration electrode 310 may be substantially the same as the material contained in the first penetration electrode 110. The second penetration electrode 310 may electrically connect the second floating diffusion region FD2 and the organic photoelectric conversion element OPD.

The first portion 310a of the second penetration electrode 310 may be surrounded by the second insulating film 313. The second insulating film 313 may correspond to the first insulating film 113.

The second etch stop film 340 may be disposed below the first surface S1 of the substrate 100 of the second pixel region PR2. The second etch stop film 340 may be disposed to cover the lower surface of the second penetration electrode 310, the third transfer gate TG3, the fourth transfer gate TG4 and the second floating diffusion region FD2. The material contained in the second etch stop film 340 may be substantially the same as the material contained in the first etch stop film 140. The first etch stop film 140 and the second etch stop film 340 may be connected to each other or may be separated from each other, due to DTI (Deep Trench Isolation) between the first pixel region PR1 and the second pixel region PR2.

The second interlayer insulating film 150 and the third interlayer insulating film 170 may be disposed not only over the first pixel region PR1 but also over the second, third and fourth pixel regions PR2, PR3 and PR4. The second interlayer insulating film 150 may further include sixth, seventh, eighth, ninth and tenth contacts 351, 353, 355, 357, and 359 in the second pixel region PR2.

Each of the sixth to tenth contacts 351, 353, 355, 357, and 359 may correspond to each of the first to fifth contacts 151, 153, 155, 157, and 159. The upper surfaces of each of the sixth to the tenth contacts 351, 353, 355, 357, and 359 may be located on the same plane. The upper surfaces of each of the sixth to tenth contacts 351, 353, 355, 357, and 359 may be located at the same height with reference to the first surface S1 of the substrate 100. The upper surfaces of each of the sixth to tenth contacts 351, 353, 355, 357, and 359 may be located on the same plane as the upper surface of the second interlayer insulating film 150.

The second wiring 371 may be disposed in the third interlayer insulating film 170 of the second pixel region PR2. For example, the second wiring 371 may connect the sixth contact 351 and the seventh contact 353. The material contained in the second wiring 371 may be, for example, substantially the same as the material included in the first wiring 171.

In some example embodiments, the organic photoelectric conversion element OPD may be electrically connected to the second floating diffusion region FD2 through the second penetration electrode 310, the sixth contact 351, the second wiring 371 and the seventh contact 353. For example, the fourth transfer gate TG4 may transfer the fourth optical signal, which is the optical charge generated from the organic photoelectric conversion element OPD, to the second floating diffusion region FD2, using the second penetration electrode 310, the sixth contact 351, the second wiring 371, the seventh contact 353 and the source region 334 of the fourth transfer transistor TR4.

Hereinafter, a method for manufacturing the image sensor according to some example embodiments of the present inventive concepts will be described with reference to FIGS. 9 to 17. For the sake of clarity of explanation, repeated description will not be provided.

FIGS. 9, 10, 11, 12, 13, 14, 15, 16, and 17 are intermediate step diagrams for explaining the method for manufacturing the image sensor according to some example embodiments of the present inventive concepts, respectively.

Figure 9:
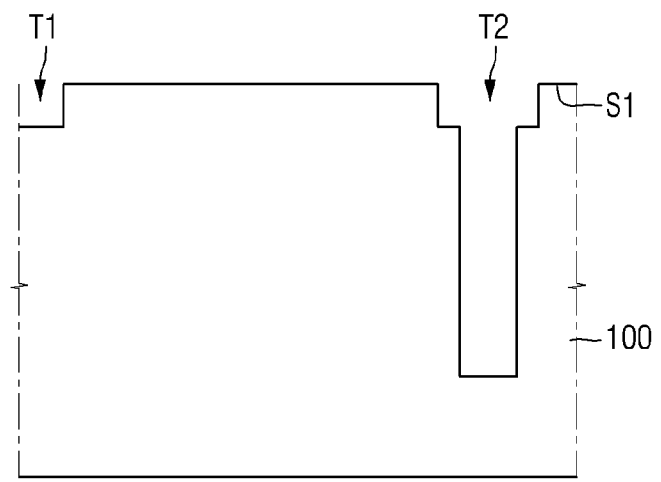
FIGS. 9, 10, 11, 12, 13, 14, 15, 16, and 17 are intermediate step diagrams for explaining a method for manufacturing the image sensor according to some example embodiments of the present inventive concepts.

Referring to FIG. 9, a first trench T1 and a second trench T2 may be formed on a first surface S1 of the substrate 100. As shown in FIG. 9, each of the first trench T1 and the second trench T2 may extend into an interior of the substrate 100. The sidewall of the second trench T2 may include portions with different widths, but the present inventive concepts is not limited thereto.

Figure 10:
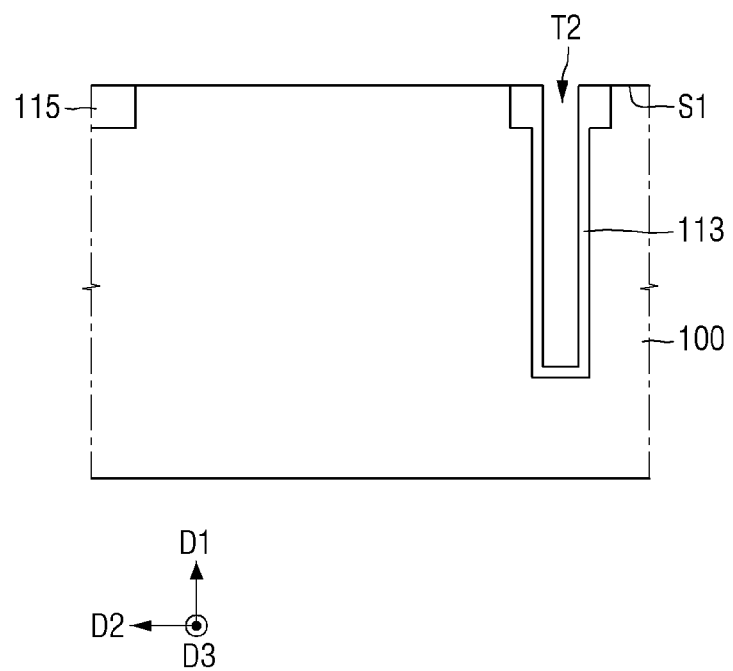

Referring to FIG. 10, a first insulating film 113 and a first element isolation film 115 may be formed. The first element isolation film 115 may be formed to fill the first trench T1. As shown in FIG. 9, the first insulating film 113 may be formed to extend along the side surfaces and the bottom surface of the second trench T2. The first insulating film 113 may not fill all of the second trench T2.

Figure 11:
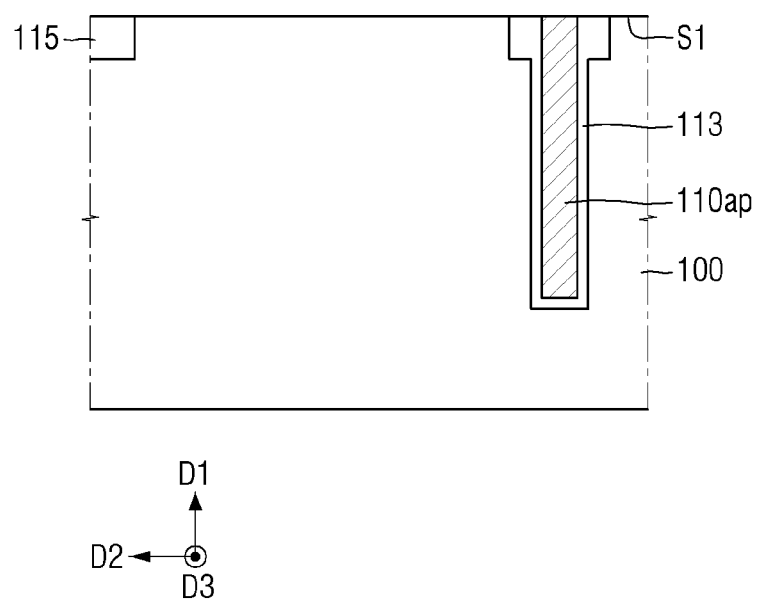

Referring to FIG. 11, by filling a portion of the second trench T2 which is left after the first insulating film 113 is formed (e.g., a remainder of the second trench T2 that is not filled by the first insulating film 113), a pre penetration electrode 110ap may be formed, such that the second trench T2 is entirely filled by a combination of the first insulating film 113 and the pre penetration electrode 110ap. The pre penetration electrode 110ap may be formed on the first insulating film 113. The second trench T2 may be filled with the first insulating film 113 and the pre penetration electrode 110ap.

Figure 12:
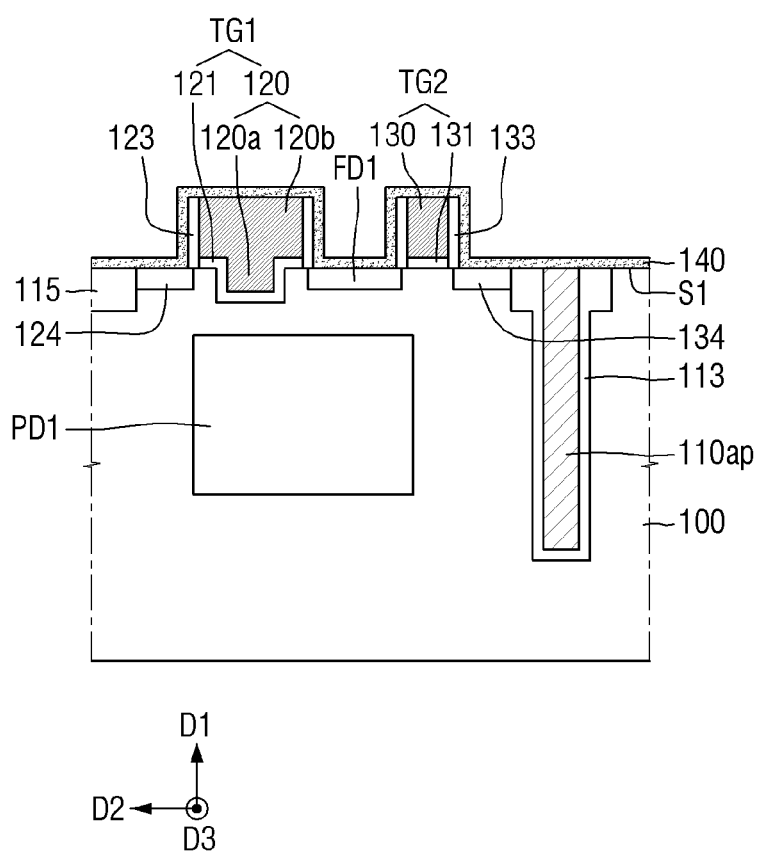

Referring to FIG. 12, a first semiconductor photoelectric conversion element PD1, a first floating diffusion region FD1, a first transfer transistor TR1, a second transfer transistor TR2, and a first etch stop film 140 may be formed. As shown in FIG. 12, the first semiconductor photoelectric conversion element PD1 may be formed inside the substrate 100 so as to be spaced apart from the pre penetration electrode 110ap. The first transfer gate TG1 and the second transfer gate TG2 may be formed on the first surface S1 of the substrate 100. As shown in FIG. 12, the first transfer gate TG1 may be formed on a first side of the floating diffusion region FD1 on the first surface S1 of the substrate 100, and the second transfer gate TG2 may be formed on a second side of the floating diffusion region FD1 facing the first side on the first surface S1 of the substrate 100 between the pre penetration electrode 110ap and the floating diffusion region FD1. As shown in FIG. 12, the source region 124 of the first transfer transistor TR1 may be formed on one side of the first transfer gate TG1, and the first floating diffusion region FD1 may be formed on the other side of the first transfer gate TG1. In some example embodiments, the source region 134 of the second transfer transistor TR2 may be formed on the other side of the second transfer gate TG2. The second transfer gate TG2 may be formed between the pre penetration electrode 110ap and the first floating diffusion region FD1.

The first floating diffusion region FD1 may be formed on the first surface S1 of the substrate 100 so as to be spaced apart from the pre penetration electrode 110ap. As referred to herein, an element that is "spaced apart" from another element will be understood to be isolated from direct contact with the other element. The first etch stop film 140 may be formed so as to entirely cover the first surface S1 of the substrate 100. Therefore, the constituent elements (for example, the first transfer gate TG1, the first transfer gate spacer 123 and the second transfer gate spacer 133, and the second transfer gate TG2) formed on the first surface S1 of the substrate 100 may be covered with the first etch stop film 140. Therefore, the first etch stop film 140 may cover the upper surfaces of the first transfer gate TG1, the second transfer gate TG2, the first floating diffusion region FD1 and the pre penetration electrode 110ap. Thus, as shown in FIG. 12, the first etch stop film 140 may cover the first transfer gate TG1, the second transfer gate TG2, an upper surface of the floating diffusion region FD1 and an upper surface of the pre penetration electrode 110ap, on the first surface S1 of the substrate 100.

Figure 13:
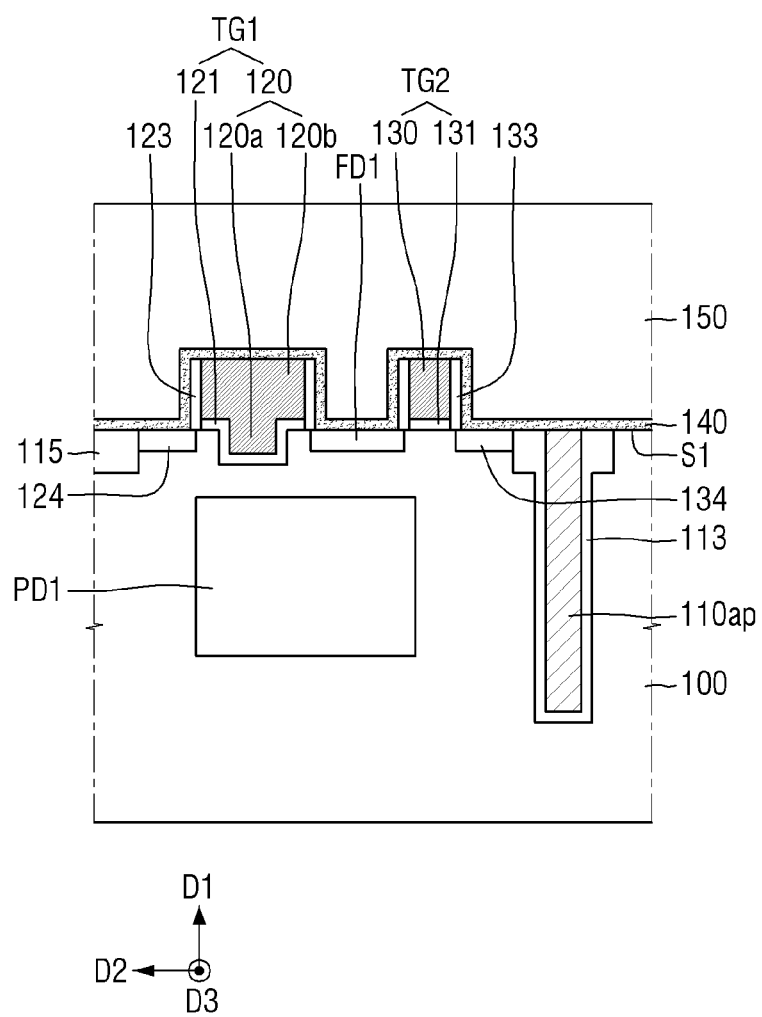

Referring to FIG. 13, the second interlayer insulating film 150 may be formed on the first etch stop film 140.

Figure 14:
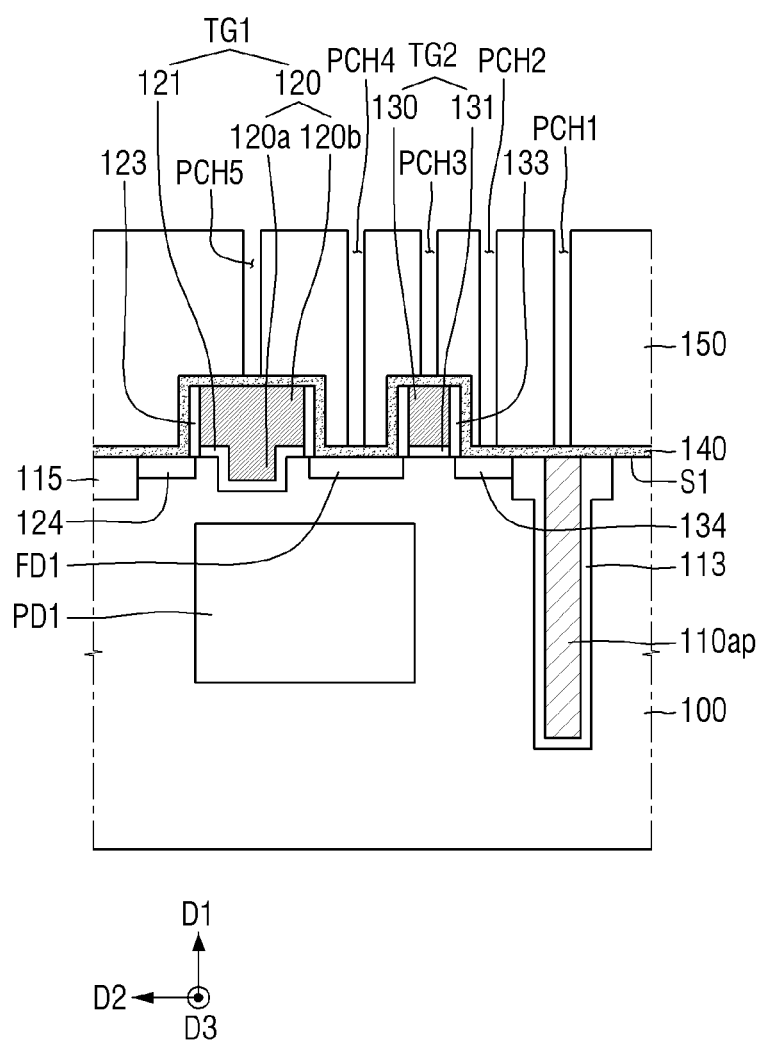

Referring to FIG. 14, the first, second, third, fourth and fifth pre contact holes PCH1, PCH2, PCH3, PCH4, and PCH5 may be formed in the second interlayer insulating film 150 so as to be spaced apart from each other. The first to fifth pre contact holes PCH1, PCH2, PCH3, PCH4, and PCH5 may extend in the second interlayer insulating film 150 along the first direction D1. The first to fifth pre contact holes PCH1, PCH2, PCH3, PCH4, and PCH5 may expose the first etch stop film 140. The first pre contact hole PCH1 may be formed on the first penetration electrode 110. The second pre contact hole PCH2 may be formed on the source region 134 of the second transfer transistor TR2. The third pre contact hole PCH3 may be formed on the second transfer gate TG2. The fourth pre contact hole PCH4 may be formed on the first floating diffusion region FD1. The fifth pre contact hole PCH5 may be formed on the first transfer gate TG1.

Figure 15:
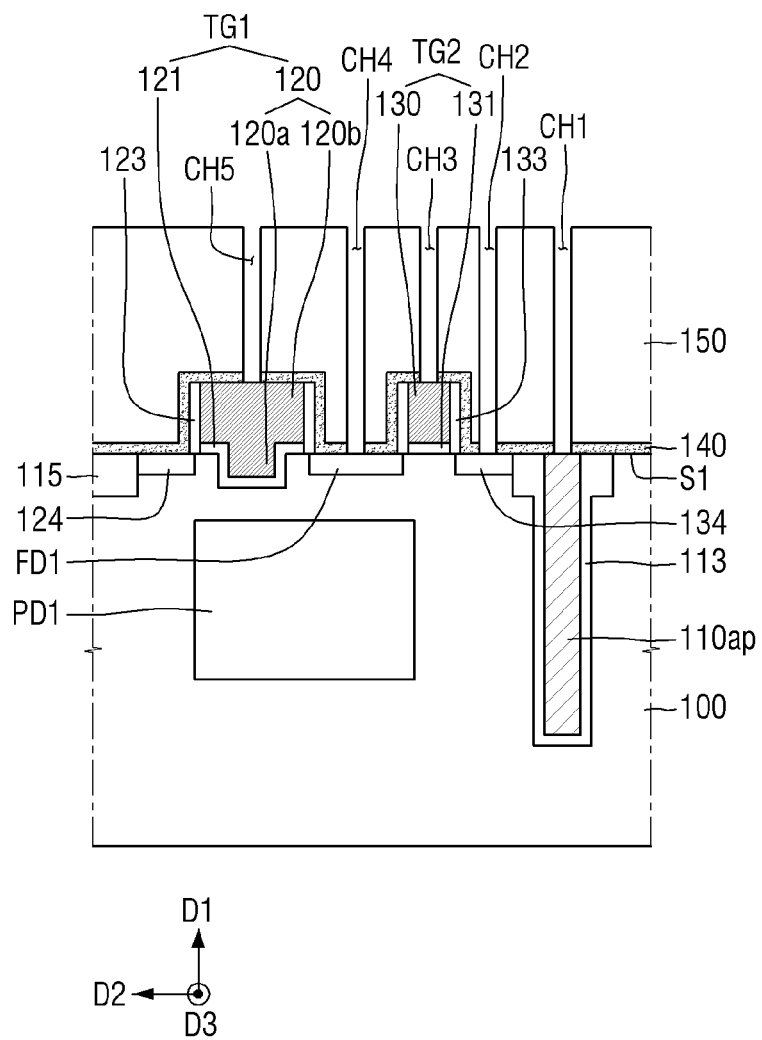

Referring to FIG. 15, each of the first, second, third, fourth and fifth contact holes CH1, CH2, CH3, CH4, and CH5 penetrating the first etch stop film 140 may be formed. Each of the first to fifth contact holes CH1, CH2, CH3, CH4, and CH5 may be formed by removing the first etch stop film 140 exposed by each of the first to fifth contact holes PCH1, PCH2, PCH3, PCH4, and PCH5. The first contact hole CH1 may penetrate the second interlayer insulating film 150 and the first etch stop film 140 to expose the pre penetration electrode 110ap. The second contact hole CH2 may expose the source region 134 of the second transfer transistor TR2. The third contact hole CH3 may expose the second transfer gate electrode 130. The fourth contact hole CH4 may penetrate the second interlayer insulating film 150 and the first etch stop film 140 to expose the floating diffusion region FD1. The fifth contact hole CH5 may expose the first transfer gate electrode 120. In the method for manufacturing the image sensor according to the present inventive concepts, the first to fifth contact holes CH1, CH2, CH3, CH4, and CH5 may be formed at the same time (e.g., may be simultaneously formed). As shown in FIG. 15, the upper surfaces of the first to fifth contact holes CH1, CH2, CH3, CH4, and CH5 (e.g., the surfaces distal from the first etch stop film 140) may be coplanar or substantially coplanar.

As shown in FIG. 15, the pre penetration electrode 110ap, the semiconductor photoelectric conversion element PD1, the floating diffusion region FD1, the first transfer gate TG1, the second transfer gate TG2, and the first to fifth contact holes CH1, CH2, CH3, CH4, and CH5 are formed in the first pixel region PR1.

Figure 16:
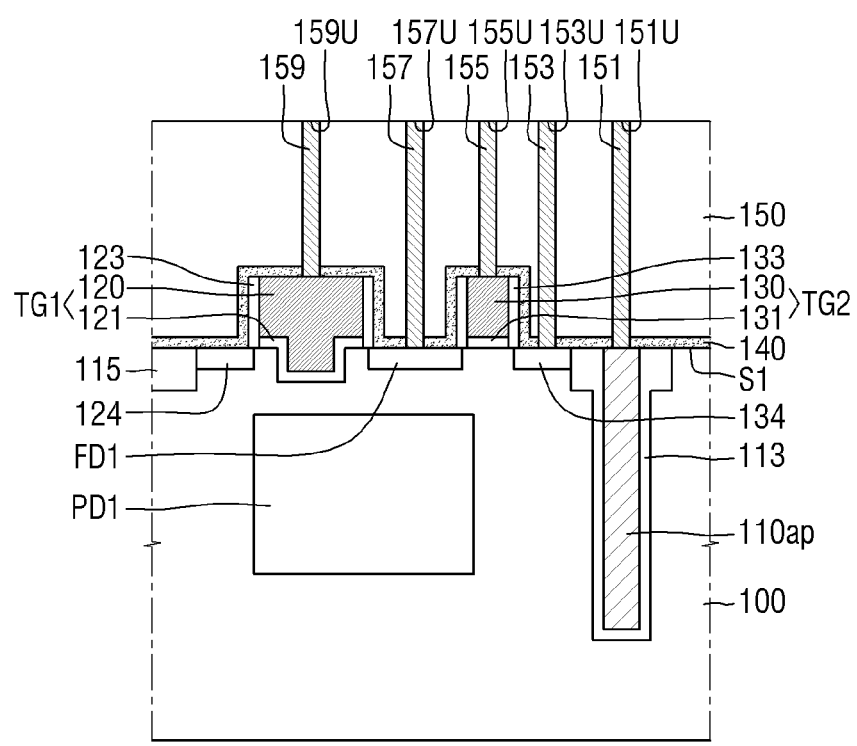

Referring to FIG. 16, first to fifth contacts 151, 153, 155, 157, and 159 may be formed. Each of the first to fifth contacts 151, 153, 155, 157, and 159 may be formed by filling each of the first to fifth contact holes CH1, CH2, CH3, CH4, and CH5 with a contact material. For example, a first contact 151 may fill the first contact hole CH1, a second contact 153 may fill the second contact hole CH2, a third contact 155 may fill the third contact hole CH3, a fourth contact 157 may fill the fourth contact hole CH4, and a fifth contact 159 may fill the fifth contact hole CH5.

In the method for manufacturing the image sensor according to the present inventive concepts, the first to fifth contacts 151, 153, 155, 157, and 159 may be formed at the same time. For example, the contact material fills the first to fifth contact holes CH1, CH2, CH3, CH4, and CH5 and may also be formed on the second interlayer insulating film 150. The first to fifth contacts 151, 153, 155, 157, and 159 may be formed, for example, by removing a contact material formed on the second interlayer insulating film 150 through a planarization process or the like. Therefore, the first surfaces 151U, 153U, 155U, 157U, and 159U of the first to fifth contacts may be located on the same plane.

Figure 17:
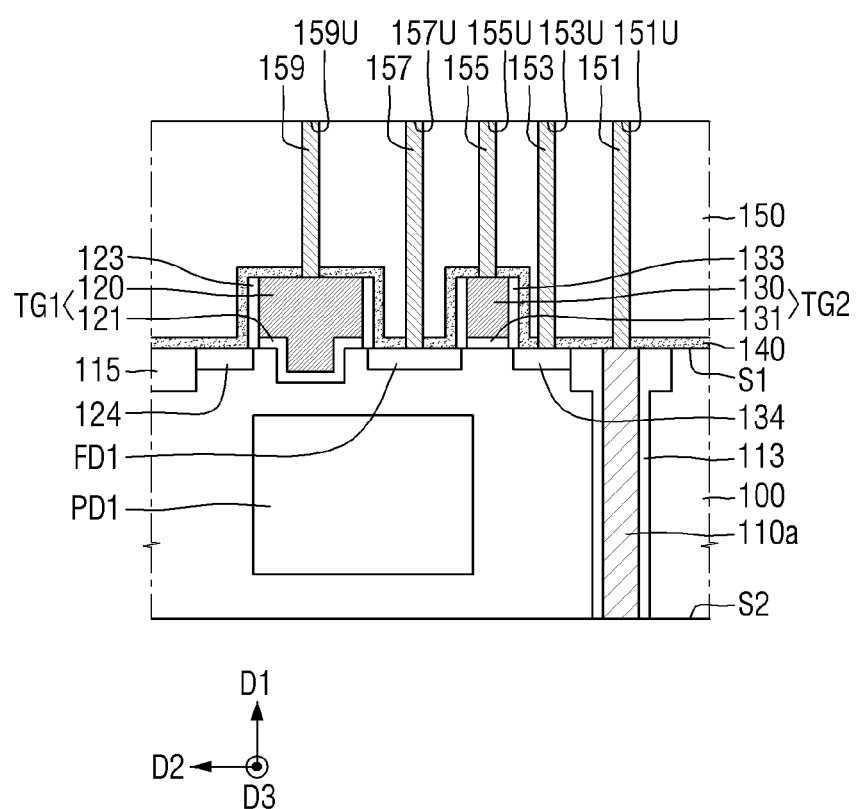

Referring to FIG. 17, a first portion 110a of the first penetration electrode may be formed. The first portion 110a of the first penetration electrode may be formed by removing a part of the substrate 100 and a part of the bottom surface of the second trench T2 so that the pre penetration electrode 110ap is exposed. A part of the first insulating film 113 formed on the bottom surface of the second trench T2 may also be removed in order to form the first portion 110a of the first penetration electrode. The second surface S2 of the substrate 100 may expose the first portion 110a of the first penetration electrode.

Referring to FIG. 5, the protective planarization film 210, the first color filter CF1, the first interlayer insulating film 220, and the organic photoelectric conversion element OPD may be formed on the second surface S2 of the substrate 100. Further, a second portion 110b of the first penetration electrode may be formed to penetrate the protective planarization film 210 and the first interlayer insulating film 220. The first portion 110a and the second portion 110b of the first penetration electrode may be connected to each other.

Accordingly, a first penetration electrode 110 penetrating the substrate 100 may be formed based on removing a portion of the substrate 100 and a portion of the bottom surface of the trench T2 to expose the pre penetration electrode 110ap.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:
1. An image sensor comprising:
a substrate, the substrate including a unit pixel region, the unit pixel region including a pixel transistor formation region and at least one pixel region, the substrate including a first surface and a second surface, the first surface and the second surface facing each other, the second surface configured to be a light-incident surface;
a first semiconductor photoelectric conversion element disposed inside the substrate such that the first semi- conductor photoelectric conversion element is at least partially enclosed by the substrate;

an organic photoelectric conversion element formed on the second surface of the substrate;

a first floating diffusion region formed on the first surface of the substrate;

a first transfer transistor having a first end connected to the first semiconductor photoelectric conversion element and a second end connected to the first floating diffusion region;

a second transfer transistor having a first end connected to the organic photoelectric conversion element and a second end connected to the first floating diffusion region;

a first penetration electrode connected to the organic photoelectric conversion element, the first penetration electrode including at least a first portion and a second portion, the first portion of the first penetration electrode extending from the first surface of the substrate to the second surface of the substrate;

a first contact extending from the first surface of the substrate in a first direction, the first contact including a first surface and a second surface, the second surface of the first contact facing the first surface of the first contact, the second surface of the first contact is in contact with the first penetration electrode; and a second contact extending from the first surface of the substrate in the first direction, the second contact including a third surface and a fourth surface, the fourth surface facing the third surface, the fourth surface in contact with a source region of the second transfer transistor, wherein the at least one pixel region includes a first pixel region, and the first semiconductor photoelectric conversion element, the first floating diffusion region, and the first transfer transistor and the second transfer transistor are in the first pixel region.

2. The image sensor of claim 1, wherein the first direction is a direction extending from the second surface of the substrate toward the first surface of the substrate, and the first surface of the first contact and the third surface of the second contact are substantially coplanar.

3. The image sensor of claim 2, wherein the first transfer transistor includes a first transfer gate that is configured to transfer a first electric charge to the first floating diffusion region, the first electric charge generated by the first semiconductor photoelectric conversion element, and the second transfer transistor includes a second transfer gate that is configured to transfer a second electric charge to the first floating diffusion region, using the first penetration electrode, the first contact, and the second contact, the second electric charge generated by the organic photoelectric conversion element.

4. The image sensor of claim 2, further comprising:

an etch stop film formed on the first surface of the substrate such that the etch stop film covers the first penetration electrode, the first transfer transistor, the second transfer transistor, and the first floating diffusion region, wherein the first contact and the second contact penetrate the etch stop film.

5. The image sensor of claim 2, wherein the first penetration electrode is in the first pixel region.

6. The image sensor of claim 1, further comprising:

a reset transistor configured to reset the first floating diffusion region, a first end of the reset transistor being connected to a power supply voltage and a second end of the reset transistor being connected to the first floating diffusion region; and a source follower transistor having a gate connected to the first floating diffusion region, wherein the reset transistor and the source follower transistor are in the pixel transistor formation region.

7. The image sensor of claim 1, wherein the at least one pixel region further includes a second pixel region spaced apart from the first pixel region, and the second pixel region includes a second semiconductor photoelectric conversion element disposed inside the substrate such that the second semiconductor photoelectric conversion element is at least partially enclosed by the substrate;

a second floating diffusion region formed on the first surface of the substrate;

a third transfer transistor having a first end connected to the second semiconductor photoelectric conversion element and a second end connected to the second floating diffusion region; and a fourth transfer transistor having a first end connected to the organic photoelectric conversion element and a second end connected to the second floating diffusion region.

8. The image sensor of claim 7, further comprising:

a first color filter disposed between the first semiconductor photoelectric conversion element and the organic photoelectric conversion element; and a second color filter disposed between the second semiconductor photoelectric conversion element and the organic photoelectric conversion element.

9. An image sensor comprising:

a substrate, the substrate including a first surface and a second surface, the first surface and the second surface facing each other, the second surface configured to be a light-incident surface;

a first semiconductor photoelectric conversion element disposed inside the substrate such that the first semiconductor photoelectric conversion element is at least partially enclosed by the substrate;

an organic photoelectric conversion element formed on the second surface of the substrate;

a first floating diffusion region formed on the first surface of the substrate;

a first penetration electrode configured to electrically connect the organic photoelectric conversion element with the first floating diffusion region, the first penetration electrode including at least a first portion and a second portion, the first portion of the first penetration electrode penetrating the substrate;

a first contact extending from the first surface of the substrate in a first direction, the first contact including a first surface and a second surface, the second surface of the first contact facing the first surface of the first contact, the second surface of the first contact is in contact with the first penetration electrode; and a second contact extending from the first surface of the substrate in the first direction, the second contact including a third surface and a fourth surface, the fourth surface facing the third surface, the fourth surface in contact with the first floating diffusion region, wherein the first direction is a direction from the second surface of the substrate toward the first surface of the substrate, and the first surface of the first contact and the third surface of the second contact are substantially coplanar.

10. The image sensor of claim 9, further comprising:

a first transfer transistor having a first end connected to the first semiconductor photoelectric conversion element and a second end connected to the first floating diffusion region;

a second transfer transistor having a first end connected to the organic photoelectric conversion element and a second end connected to the first floating diffusion region, wherein the substrate includes a unit pixel region, the unit pixel region including a pixel transistor formation region and at least one pixel region, the at least one pixel region includes a first pixel region, and the first semiconductor photoelectric conversion element, the first floating diffusion region, and the first transfer transistor and the second transfer transistor are in the first pixel region.

11. The image sensor of claim 10, wherein the first transfer transistor includes a first transfer gate, the second transfer transistor includes a second transfer gate, the first transfer gate is configured to transfer a first electric charge to the first floating diffusion region, the first electric charge generated by the first semiconductor photoelectric conversion element, and the second transfer gate is configured to transfer a second electric charge using the first penetration electrode and the first contact, the second electric charge generated by the organic photoelectric conversion element.

12. The image sensor of claim 10, further comprising:

an etch stop film formed on the first surface of the substrate such that the etch stop film covers the first penetration electrode, the first transfer transistor, the second transfer transistor, and the first floating diffusion region, wherein the first contact and the second contact penetrate the etch stop film.

13. The image sensor of claim 9, further comprising:

a first transfer gate formed on the first surface of the substrate, the first transfer gate configured to transfer a first electric charge to the first floating diffusion region, the first electric charge generated by the first semiconductor photoelectric conversion element;

a second transfer gate formed on the first surface of the substrate, the second transfer gate configured to transfer a second electric charge to the first floating diffusion region, using the first penetration electrode and the first contact, the second electric charge generated by the organic photoelectric conversion element, wherein the substrate includes a unit pixel region, the unit pixel region including a pixel transistor formation region and at least one pixel region, the at least one pixel region includes a first pixel region, and the first semiconductor photoelectric conversion element, the first floating diffusion region, and the first transfer gate and the second transfer gate are in the first pixel region.

14. The image sensor of claim 13, further comprising:

a reset transistor configured to reset the first floating diffusion region, a first end of the reset transistor being connected to a power supply voltage, and a second end thereof being connected to the first floating diffusion region; and a source follower transistor having a gate connected to the first floating diffusion region, wherein the reset transistor and the source follower transistor are in the pixel transistor formation region.

15. An image sensor comprising:

a substrate including a first surface and a second surface, the first surface and the second surface facing each other, the second surface configured to be a light-incident surface;

a first semiconductor photoelectric conversion element disposed inside the substrate such that the first semiconductor photoelectric conversion element is at least partially enclosed by the substrate;

an organic photoelectric conversion element formed on the second surface of the substrate;

a first floating diffusion region formed on the first surface of the substrate;

a first transfer gate which is on the first surface of the substrate and configured to transfer a first electric charge to the first floating diffusion region, the first electric charge generated by the first semiconductor photoelectric conversion element;

a first penetration electrode connected to the organic photoelectric conversion element, the first penetration electrode including at least a first portion and a second portion, the first portion of the first penetration electrode extending from the first surface of the substrate to the second surface of the substrate; and a second transfer gate formed on the first surface of the substrate and configured to transfer a second electric charge to the first floating diffusion region, using the first penetration electrode, the second electric charge generated by the organic photoelectric conversion element.

16. The image sensor of claim 15, wherein the substrate includes a unit pixel region, the unit pixel region including a pixel transistor formation region and at least one pixel region, the at least one pixel region includes a first pixel region, and the first semiconductor photoelectric conversion element, the first floating diffusion region, and the first transfer gate and the second transfer gate are in the first pixel region.

17. The image sensor of claim 16, further comprising:

a reset transistor which configured to reset the first floating diffusion region, a first end of the reset transistor being connected to a power supply voltage, and a second end thereof being connected to the first floating diffusion region; and a source follower transistor having a gate connected to the first floating diffusion region, wherein the reset transistor and the source follower transistor are in the pixel transistor formation region.

18. The image sensor of claim 16, wherein the at least one pixel region further includes a second pixel region spaced apart from the first pixel region, and the second pixel region includes a second semiconductor photoelectric conversion element disposed inside the substrate such that the second semiconductor photoelectric conversion element is at least partially enclosed by the substrate;

a second floating diffusion region formed on the first surface of the substrate;

a third transfer transistor having a first end connected to the second semiconductor photoelectric conversion element, and a second end connected to the second floating diffusion region; and a fourth transfer transistor having a first end connected to the organic photoelectric conversion element, and a second end connected to the second floating diffusion region.

19. The image sensor of claim 18, further comprising:

a first color filter disposed between the first semiconductor photoelectric conversion element and the organic photoelectric conversion element; and a second color filter disposed between the second semiconductor photoelectric conversion element and the organic photoelectric conversion element.

20. The image sensor of claim 15, further comprising:

a first contact extending from the first surface of the substrate in a first direction, the first contact including a first surface and a second surface, the second surface of the first contact facing the first surface of the first contact, the second surface of the first contact is in contact with the first penetration electrode; and a second contact extending from the first surface of the substrate in the first direction, the second contact including a third surface and a fourth surface, the fourth surface facing the third surface, the fourth surface in contact with the first floating diffusion region, wherein the first direction is a direction from the second surface of the substrate toward the first surface of the substrate, and the first surface of the first contact and the third surface of the second contact are substantially coplanar.

* * * * *